(12) United States Patent
Ezaki et al.

(10) Patent No.: US 7,016,221 B2
(45) Date of Patent: Mar. 21, 2006

(54) MAGNETORESISTIVE EFFECT ELEMENT, MAGNETIC MEMORY DEVICE AND METHOD OF FABRICATING THE SAME

(75) Inventors: Joichiro Ezaki, Tokyo (JP); Keiji Koga, Tokyo (JP); Yuji Kakinuma, Tokyo (JP)

(73) Assignee: TDK Corporation, Tokyo (JP)

( * ) Notice: Subject to any disclaimer, the term of this patent is extended or adjusted under 35 U.S.C. 154(b) by 229 days.

(21) Appl. No.: 10/660,605

(22) Filed: Sep. 12, 2003

(65) Prior Publication Data

US 2004/0114275 A1 Jun. 17, 2004

(30) Foreign Application Priority Data

Sep. 13, 2002 (JP) ............... P. 2002-307686

(51) Int. Cl.
*G11C 11/00* (2006.01)

(52) U.S. Cl. ............... 365/158; 365/171; 365/173
(58) Field of Classification Search ........... 365/158, 365/171, 173
See application file for complete search history.

(56) References Cited

U.S. PATENT DOCUMENTS

| 5,343,422 A | 8/1994 | Kung et al. |
| 5,629,922 A | 5/1997 | Moodera et al. |
| 6,404,674 B1 | 6/2002 | Anthony et al. |
| 2005/0052899 A1 * | 3/2005 | Hatate .................. 365/154 |

FOREIGN PATENT DOCUMENTS

| EP | 1 107 329 | 6/2001 |
| JP | 9-91949 | 4/1997 |
| JP | 2001-256773 | 9/2001 |
| JP | 2001-273759 | 10/2001 |

* cited by examiner

*Primary Examiner*—Son T. Dinh
(74) *Attorney, Agent, or Firm*—Oblon, Spivak, McClelland, Maier & Neustadt, P.C.

(57) ABSTRACT

A magnetoresistive effect element includes a laminated body including a magnetosensitive layer a magnetizing direction of which is changed by an external magnetic field and constituted such that a current is made to flow in a direction orthogonal to a laminated layer face thereof, and a annular magnetic layer arranged at a side of one face of the laminated body to constitute an axial direction by a direction along the laminated layer face and constituted to be penetrated by a plurality of lead wires and therefore, a closed magnetic path can be formed by making current flow to a plurality of lead wires and inversion of magnetization at the magnetosensitive layer can further efficiently be carried out.

31 Claims, 22 Drawing Sheets

MAGNETORESISTIVE EFFECT ELEMENT, MAGNETIC MEMORY DEVICE AND METHOD OF FABRICATING THE SAME

BACKGROUND OF THE INVENTION

The present invention relates to a magnetoresistive effect element including a ferromagnetic substance a magnetizing direction of which is changed by an external magnetic field, a magnetic memory device for storing information by utilizing a change in the magnetizing direction, and a method of fabricating the same.

Conventionally, as a general-purpose memory used in information processing apparatus of a computer, a communication apparatus and the like, a volatile memory such as DRAM, SRAM or the like is used. The volatile memories need to refresh by incessantly supplying current for holding memory. Further, since all the information is lost when a power source is cut off, a nonvolatile memory needs to install as means for recording information other than the volatile memories and, for example, flash EEPROM, a magnetic hard disk device or the like is used therefor.

In the nonvolatile memories, high speed access poses an important problem in accordance with tendency of high speed information processing. Further, there is rapidly progressed development of information apparatus aiming at so-to-speak ubiquitous computing capable of carrying out information processing at anytime and at anywhere in accordance with rapid spreading the high performance portable information apparatus. Development of a nonvolatile memory applicable to high speed processing has strongly been requested as a key device constituting the core of developing such an information apparatus.

As a technology effective to speedup a nonvolatile memory, there is known a magnetic random access memory (hereinafter, referred to as MRAM) in which magnetic memory elements for storing information by a magnetizing direction along an easy magnetization access of a ferromagnetic layer are aligned in a matrix shape. In MRAM, information is stored by utilizing a combination of magnetizing directions in two ferromagnetic substances. Meanwhile, stored information is detected by a change of resistance (that is, change of current or voltage) produced by a case in which the magnetizing directions are in parallel and same direction with each other relative to a certain direction constituting a reference and a case in which the magnetizing directions are in parallel and opposite with each other.

An MRAM which has currently been reduced into practice utilizes a giant magneto-resistive (GMR) effect. The MRAM utilizing a GMR element achieving the GMR effect described in U.S. Pat. No. 5,343,422 has been known. The GMR effect is a phenomenon in which a resistance value becomes a minimum value when magnetizing directions in two parallel magnetic layers along a direction of an easy magnetization axis are in parallel and same direction with each other, and becomes a maximum value when the magnetizing directions are in parallel and opposit direction with each other. As MRAM using a GMR element, there are a coercive force difference type (Pseudo spin valve type) and an exchange bias type (spin valve type). In the case of MRAM of the coercive force difference type, the GMR element includes two ferromagnetic layers and a nonmagnetic layer interposed therebetween and information is written and read by utilizing a difference between the coercive forces of the two ferromagnetic substances. Here, a resistance change rate when the GMR element is constructed by a constitution of, for example, "nickel iron alloy (NiFe)/ copper (Cu)/cobalt (Co)" is a small value of about 6 through 8%. Meanwhile, in the case of MRAM of the exchange bias type, the GMR element includes a fixed layer fixed with the magnetizing direction by antiferromagnetic coupling with an antiferromagentic layer, a free layer the magnetizing direction of which is changed by an external magnetic field and a nonmagnetic layer interposed therebetween for writing and reading information by utilizing a difference between the magnetizing directions of the fixed layer and the free layer. A resistance change rate when the GMR element is constructed by a constitution of, for example, "platinum manganese (PtMn)/cobalt iron (CoFe)/copper (Cu)/CoFe" is about 10% which indicates a value larger than that of the coercive force difference type. However, this value is insufficient for achieving a further increase in the storing speed or a further increase in the access speed.

In order to resolve the points, there has been proposed MRAM having a TMR element utilizing a tunnel magnetoresistive effect (hereinafter, referred to as TMR effect). The TMR effect is an effect in which by a relative angle in magnetizing direction between two ferromagnetic layers interposing an extremely thin insulating layer (tunnel barrier layer), tunnel current flowing to pass the insulating layer is changed. When the magnetizing directions of the two ferromagnetic layers are in parallel and same direction with each other, a resistance value is minimized and when the magnetizing directions are in parallel and opposite direction with each other, the resistance value is maximized. In the case of MRAM utilizing the TMR effect, when the TMR element is constructed by a constitution of "CoFe/aluminum oxide/CoFe", the resistance change rate is as high as about 40%, further, also the resistance value is large and therefore, matching in the case of being combined with a semiconductor device of MOSFET or the like is easy to take. Therefore, an output higher than that of MRAM having the GMR element is easy to achieve and an increase in the storage capacitance or the access speed is expected. In the case of MRAM utilizing the TMR effect, there is known a method of storing information by changing a magnetizing direction of a magnetic film of a TMR element to a predetermined direction by a current magnetic field generated by making current flow in a lead wire. As a method of reading stored information, there is known a method of detecting a change in the resistance of the TMR element by making current flow in a direction orthogonal to the tunnel barrier layer. Further, with regard to MRAM using the TMR effect, there is a description in U.S. Pat. No. 5,629,922 or JP-A-9-919149 or the like.

As described above, according to MRAM utilizing the TMR effect, output formation higher than that of MRAM utilizing the GMR effect can be achieved. However, even in the case of MRAM utilizing the TMR element showing the resistance change rate of about 40%, output voltage is about several tens mV and therefore, the output voltage is insufficient for realizing a magnetic memory device having a higher density.

FIG. 32 is a plane view for explaining a constitution of a conventional magnetic memory device utilizing a TMR effect and FIG. 33 shows a sectional constitution of an essential portion of the magnetic memory device in correspondence with FIG. 32. Read and write word lines 112 and 106 and a bit line 105 are intersected orthogonally and a TMR element 120 comprising a first magnetic layer 102, a tunnel barrier layer 103 and a second magnetic layer 104 is arranged to be interposed by the orthogonally intersected portion. In the case of MRM of a type in which the write bit line 105 and the write word line 106 are orthogonal to each other, a magnetizing direction in the second magnetic layer 104 constituting a free layer cannot sufficiently be aligned and it is difficult to carry out sufficiently stable writing.

Further, in the case of MRAM utilizing the TMR effect, information is stored to each memory cell by changing a magnetizing direction of a magnetic film by an induced magnetic field by current flowing in lead wires which are arranged orthogonal to each other, that is, a current magnetic field, however, the current magnetic field is an open (not confined to a specific region magnetically) magnetic field and therefore, not only the efficiency is low but also there is a concern of effecting adverse influence on a contiguous memory cell.

Further, in the case of achieving higher density formation of a magnetic memory device by highly integrating memory cells, miniaturization of a TMR element is indispensable, however, there is a concern of the following problem. That is, it seems that a counter magnetic file is increased by increasing an aspect ratio (thickness/width in laminated layer face direction) of each magnetic layer in the TMR element, a magnetic field intensity for changing the magnetizing direction of the free layer is increased and large write current is needed.

SUMMARY OF THE INVENTION

The invention has been carried out in view of such a problem and it is a first object of the invention to provide a magnetic memory device capable of carrying out stable writing operation by efficiently utilizing a stronger magnetic field and a magnetoresistive effective element mounted thereon. It is a second object thereof to provide a magnetic memory device less effecting adverse influence on a contiguous memory cell and a magnetoresistive effective element mounted thereon. Further, it is a third object thereof to provide a method of easily fabricating such a magnetic memory device.

According to the invention, there is provided a magnetoresistive effect element comprising a laminated body including a magnetosensitive layer a magnetizing direction of which is changed by an external magnetic field and constituted such that a current is made to flow in a direction orthogonal to a laminated layer face thereof, and a annular magnetic layer arranged at a side of one face of the laminated body to constitute an axial direction by a direction along the laminated layer face and constituted to be penetrated by a plurality of lead wires. Term "annular" according to the invention indicates a state of being continuous magnetically and electrically and closed. Therefore, the annular magnetic layer may include an oxide film to a degree of being produced in fabricating steps although the annular magnetic layer does not include an insulating substance for preventing current from flowing.

According to the magnetoresistive effect element of the invention, by the above-described constitution, a closed magnetic path can be formed by making current flow to a plurality of lead wires and inversion of magnetization of a magnetosensitive layer can efficiently be carried out.

According to the invention, there is provided a magnetic memory device comprising a plurality of first write lines, a plurality of second write lines extended to respectively intersect with the plurality of first write lines, and a plurality of magnetoresistive effect elements each having a laminated body including a magnetosensitive layer a magnetizing direction of which is changed by an external magnetic field and constituted such that a current flows in a direction orthogonal to a laminated layer face thereof, wherein the magnetoresistive effect element includes a annular magnetic layer arranged to a side of one face of the laminated body such that an axial direction thereof is constituted by a direction along the laminated layer face and constituted to be penetrated by the first write line and the second write line.

According to the magnetic memory device of the invention, by the above-described constitution, a closed magnetic path can be formed by making current flow to both of the first and the second write lines and inversion of magnetization of the magnetosensitive layer of the magnetoresistive effect element can efficiently be carried out.

According to the invention, there is provided a method of fabricating a magnetic main body device which is a method of fabricating a magnetic memory device, the magnetic memory device comprising a write line group including a plurality of first write lines and a plurality of second write lines extended to respectively intersect with the plurality of first write lines, and a magnetoresistive effect element having a laminated body including a magnetosensitive layer a magnetizing direction of which is changed by an external magnetic field, the method comprising a step of forming the first write line on a first insulating layer, a step of forming a second insulating layer to cover a portion of the first write line and a surrounding thereof, a step of forming the second write line on the second insulating layer, and a step of self-adjustingly forming a laminated layer structure in which the first and the second write lines are extended in parallel with each other by interposing the insulating layer by selectively etching to remove the second insulating layer and the first write line by constituting a mask by the second write line. Here, the insulating layer interposed by the first write line and the second write line in the laminated layer structure corresponds to the second insulating layer. Further, parallelism according to the invention includes an error range in fabrication of ±10°.

The method of fabricating a magnetic memory device according to the invention includes the step of self-adjustingly forming the laminated structure extended in parallel therewith and therefore, fabrication having high alignment accuracy can be carried out, further, a total of the fabricating steps can be simplified. Further, it is preferable that the laminated body is electrically connected to the annular magnetic layer.

According to the magnetoresistive effect element of the invention, it is preferable that a plurality of lead wires are constituted to extend in parallel with each other in a region of penetrating the annular magnetic layer. Thereby, a synthesized magnetic field generated by making current flow to the plurality of lead wires can be made larger than that in a case in which the plurality of write lines are intersected with each other and inversion of magnetization at the magnetosensitive layer can further efficiently be carried out.

According to the magnetoresistive effect element of the invention, at an interface between the annular magnetic layer and the laminated body, it is preferable that an area of the annular magnetic layer is larger than that of the laminated body. Unevenness of the magnetizing is prevented from causing around the magnetic layer of the annular magnetic layer which contacts with the laminated body. Magnetizing direction of the magnetosensitive layer is stabilized. Additionally, an area of free layer, which is served as a recording portion, is enlarged, and demagnetic field of the magnetosensitive layer is reduced, so that writing current can be reduced.

According to the magnetoresistive effect element of the invention, a portion of the annular magnetic layer may be constituted to serve also as the magnetosensitive layer. Or, the magnetosensitive layer may be provided separately from the annular magnetic layer to bring the magnetosensitive layer and the annular magnetic layer into a magnetic exchange coupling. Further, an interval between the magnetosensitive layer and the annular magnetic layer may be arranged with a nonmagnetic conductive layer for bringing the magnetosensitive layer and the annular magnetic layer into an antiferromagnetic coupling.

Further, the magnetoresistive effect element of the invention may be constituted such that the laminated body comprising a magnetic layer, a first magnetic layer laminated to one side of the nonmagnetic layer and having a fixed magnetizing direction, and a second magnetic layer laminated to a side of the nonmagnetic layer opposed to the first magnetic layer and functioning as the magnetosensitive layer a magnetizing direction of which is changed by an external magnetic field, wherein information is detected based on a current flowing in the laminated body. In this case, the nonmagnetic layer may comprise an insulating layer capable of bringing about a tunnel effect.

Further, according to the magnetoresistive effect element of the invention, it is preferable that the magnetosensitive layer is provided with coercive force larger than that of the annular magnetic layer. Thereby, the magnetizing direction of the magnetosensitive layer is further stabilized. Further, an antiferromagnetic third magnetic layer brought into an exchange coupling with the first magnetic layer may be arranged on a side of the first magnetic layer opposed to the nonmagnetic layer. Further, a fourth magnetic layer brought into an exchange coupling with the first magnetic layer may be arranged between the first magnetic layer and the nonmagnetic layer. In this case, a second nonmagnetic conductive layer for bringing the first magnetic layer and the fourth magnetic layer into an antiferromagnetic coupling may be arranged between the first magnetic layer and the fourth magnetic layer.

According to the magnetic memory device of the invention, it is preferable that the first write line and the second write line are constituted to extend in parallel with each other at a region of penetrating the annular magnetic layer. Thereby, a synthesized magnetic field generated by making current flow to the first and the second lead wires can be made larger than that in the case of intersecting the first and the second write lines to each other and inversion of magnetization of the magnetosensitive layer of the magnetoresistive effect element can further efficiently be carried out.

According to the magnetic memory device of the invention, a portion of the annular magnetic layer may be constituted to serve also as the magnetosensitive layer. Or, the magnetosensitive layer may be provided separately from the annular magnetic layer to bring the magnetosensitive layer and the annular magnetic layer into a magnetic exchange coupling. Further, a nonmagnetic conductive layer for bringing the magnetosensitive layer and the annular magnetic layer into an antiferromagnetic coupling may be arranged between the magnetosensitive layer and the annular magnetic layer.

The magnetic memory device of the invention may be constituted such that the laminated body comprising a nonmagnetic layer, a first magnetic layer laminated to one side of the nonmagnetic layer and having a fixed magnetizing direction, and a second magnetic layer laminated to a side of the nonmagnetic layer opposed to the first magnetic layer and functioning as the magnetosensitive layer, wherein information is detected based on a current flowing in the laminated body. In this case, it is preferable that the second magnetic layer includes coercive force larger than that of the annular magnetic layer. Because the magnetizing direction of the second magnetic layer is further stabilized thereby. Further, in this case, it is preferable that the first magnetic layer is provided with coercive force larger than that of the second magnetic layer. Because the magnetizing direction in the first magnetic layer is maintained in a constant direction.

In the above-described case, the magnetic memory device according to the invention may be constituted such that an antiferromagnetic third magnetic layer brought into an exchange coupling with the first magnetic layer is arranged on a side of the first magnetic layer opposed to the nonmagnetic layer and a fourth magnetic layer brought into an exchange coupling with the first magnetic layer is arranged between the first magnetic layer and the nonmagnetic layer. Further, a nonmagnetic conductive layer for bringing the first magnetic layer and the fourth magnetic layer into an antiferromagnetic coupling may be arranged between the first magnetic layer and the fourth magnetic layer.

Further, the magnetic memory device of the invention may be constituted such that the nonmagnetic layer comprises an insulating layer capable of bringing about a tunnel effect.

Furthermore, the magnetic memory device of the invention may be constituted such that parallel portions of the first and the second write lines extended in parallel with each other are formed by bending at least one of the first and the second write lines. In this case, it is possible that one of the first and the second write lines is extended in a shape of a rectangular wave, other thereof is extended in a linear shape and a rise portion and a fall portion of the shape of the rectangular wave correspond to the parallel portion. In this case, the bent first or second write line may be constituted to include two layer portions connected to each other via an interlayer connecting layer comprising a conductive material.

Further, the magnetic memory device of the invention may be constituted to further comprise a plurality of read lines for making a read current flow in a direction orthogonal to the laminated layer face of the laminated body in each of the magnetoresistive effect elements, wherein information is read based on a current flowing in the laminated body.

The method of fabricating a magnetic memory device according to the invention may be constituted such that the step of forming the first write line comprising a step of forming a portion of the first write line which is not in parallel with the second write line, a step of forming a third insulating layer to cover a portion of the first write line which is not in parallel with the second write line and a surrounding thereof, a step of forming an interlayer conductive layer by forming a via hole connected to an end portion of the portion of the first write line which is not in parallel with the second write line at the third insulating layer and embedding a conductive material into the via hole, and a step of forming a portion of the first write line which is included in the laminated layer structure and in parallel with the second write line on the third insulating layer such that an end portion thereof is connected to an upper portion of the interlayer conductive layer, wherein the first write line is bent to form not only in a film face direction but also in a laminating direction by connecting the portion of the first write line which is not in parallel with the second write line and the portion in parallel therewith by the interlayer conductive layer.

The method of fabricating a magnetic memory device according to the invention may further be constituted such that when the magnetic memory device further comprises a annular magnetic layer surrounding at least a portion of portions of the first write line and the second write line in parallel with each other in a annular shape, the method further comprising a step of selectively forming a first annular magnetic layer portion at a region in correspondence with at least the portion of the portions of the first and the second write lines in parallel with each other above the third insulating layer, a step of forming the laminated layer structure at the portions of the first and the second write lines in parallel with each other and thereafter forming a fourth insulating layer to cover a side face and an upper face of the laminated layer structure, and a step of forming the annular magnetic layer comprising the first and a second annular magnetic layer portion by selectively covering a side face and an upper face of the fourth insulating layer and forming the second annular magnetic layer portion to connect to the first annular magnetic layer portion.

DETAILED DESCRIPTION OF THE PREFERRED EMBODIMENTS

Embodiments of the invention will be explained in details in reference to the drawings as follows.

[First Embodiment]

First, an explanation will be given of a constitution of a magnetic memory device according to a first embodiment in reference to FIG. 1 through FIG. 7.

Figure 1:
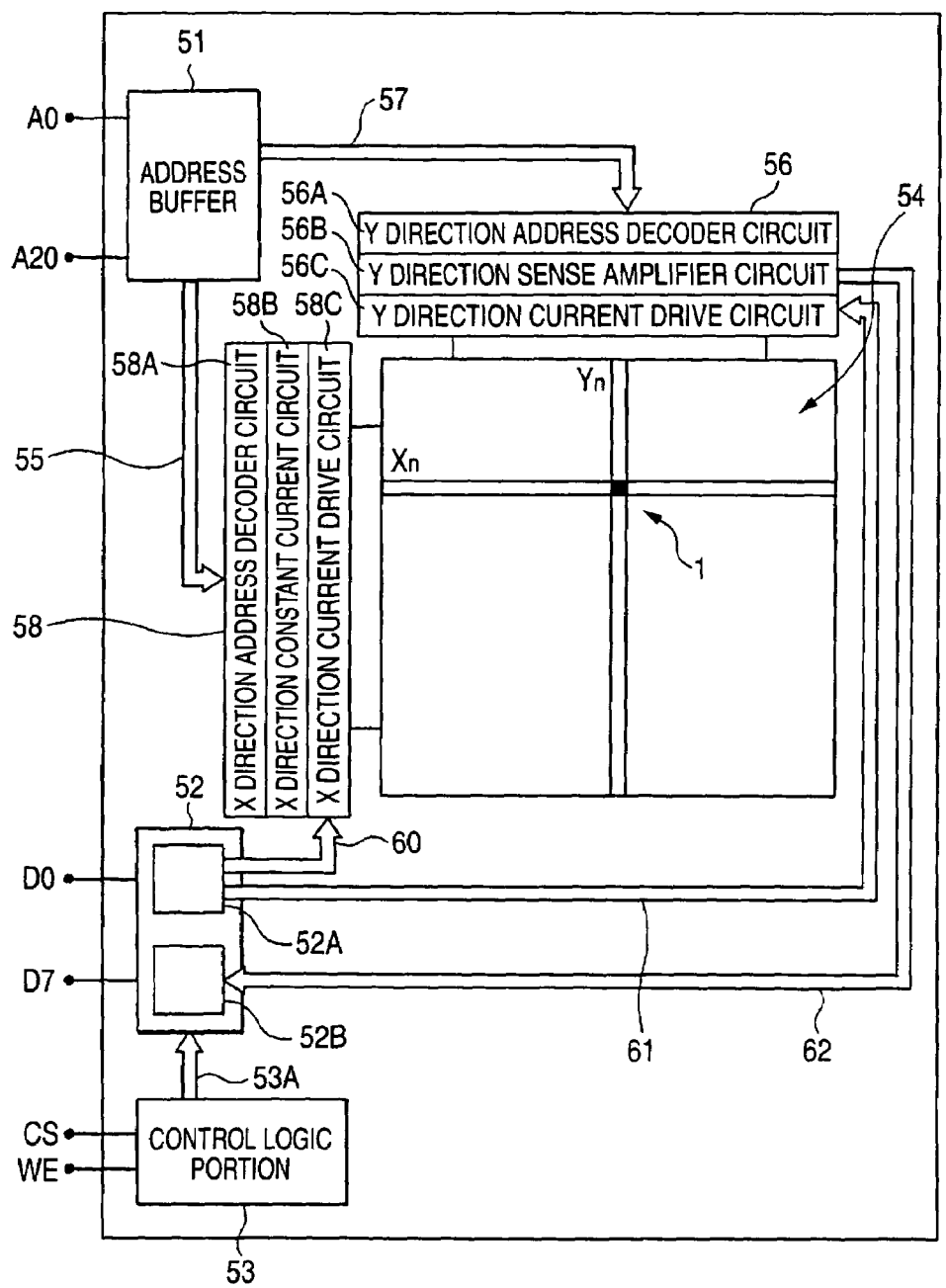
FIG. 1 is a block diagram showing a total constitution of a magnetic memory device according to a first embodiment of the invention.

FIG. 1 shows a total constitution of a magnetic memory device according to the embodiment. The magnetic memory device is provided with an address buffer 21, a data buffer 52, a control logic 53, a memory cell group 54, a first drive control circuit portion 56, a second drive control circuit portion 58, external address input terminals A0 through A20, and external data terminals D0 through D7.

The memory cell group 54 is provided with a matrix structure in which a number of memory cells 1 each having a tunnel magnetoresistive effect element (hereinafter, referred to as TMR element) are aligned in a word line direction (X direction) and a bit line direction (Y direction) orthogonal to each other. The memory cell 1 is a minimum unit for storing data in the magnetic memory device and a detailed description will be given thereto later.

The address buffer 51 inputs an address signal from outside from the external address input terminals A0 through A20 to amplify to a voltage level necessary for address for address decoder circuits 56A and 58B in the first and the second drive control circuit portions 56 and 58 by a buffer amplifier provided at inside thereof. Further, the address buffer 51 functions to divide the amplified address signal by two to output to the first drive control circuit portion 56 via an X direction address line 55 and output to the second drive control circuit portion 58 via a Y direction address line 57.

In reading an information signal stored to the memory cell group 54, the data buffer 52 amplifies the recorded information signal by a buffer amplifier provided at inside thereof to thereafter output to the external data terminals D0 through D7 at low impedance. Further, in carrying out operation of writing to the memory cell group 54, the data buffer 52 functions to input signal voltage of the external data terminals D0 through D7 to amplify to a voltage level necessary for current drive circuits 56C and 58C in the first and the second drive control circuit portions 56 and 58 by the inner buffer amplifier and to thereafter transmit to the current drive circuits 56C and 58C via an X direction writing data bus 60 and a Y direction writing data bus 61.

The control logic portion 53 functions to input signal voltage from a chip select terminal CS for selecting the memory cells 1 constituting objects of reading and writing from the memory cell group 54 and signal voltage from a write enable terminal WE which functions to output a write enable signal to output an output control signal 53A to the data buffer 52.

The first drive control circuit portion 56 includes the address decoder circuit 56A, a sense amplifier circuit 56B and the current drive circuit 56C in Y direction and the second drive control circuit portion 58 includes the address decoder circuit 58A, a constant current circuit 58B and the current drive circuit 58C in X direction.

The address decoder circuits 56A and 58A select a word decode line 71X and a bit decode line 71Y, mentioned later, in accordance with the inputted address signal. The sense amplifier circuit 56B and the constant current circuit 58B are circuits driven in carrying out reading operation and the current drive circuits 56C and 58C are circuits driven in carrying out writing operation.

The sense amplifier circuit 56B and the memory cell group 54 are connected by a plurality of the bit decode lines 71Y at which sense current flows in the reading operation. Similarly, the constant current circuit 58B and the memory cell group 54 are connected by a plurality of the word decode lines 71X, mentioned later, at which sense current flows in the reading operation.

The current drive circuit 56C and the memory cell group 54 are connected via a write bit line 5, mentioned later, which is necessary in writing operation. Similarly the current drive circuit 58C and the memory cell group 54 are connected via a write word line 6, mentioned later, which is necessary in writing operation.

A Y direction reading data bus 62 functions to transmit an output from the sense amplifier circuit 56B in Y direction to an output buffer 52B of the data buffer 52.

Figure 2:
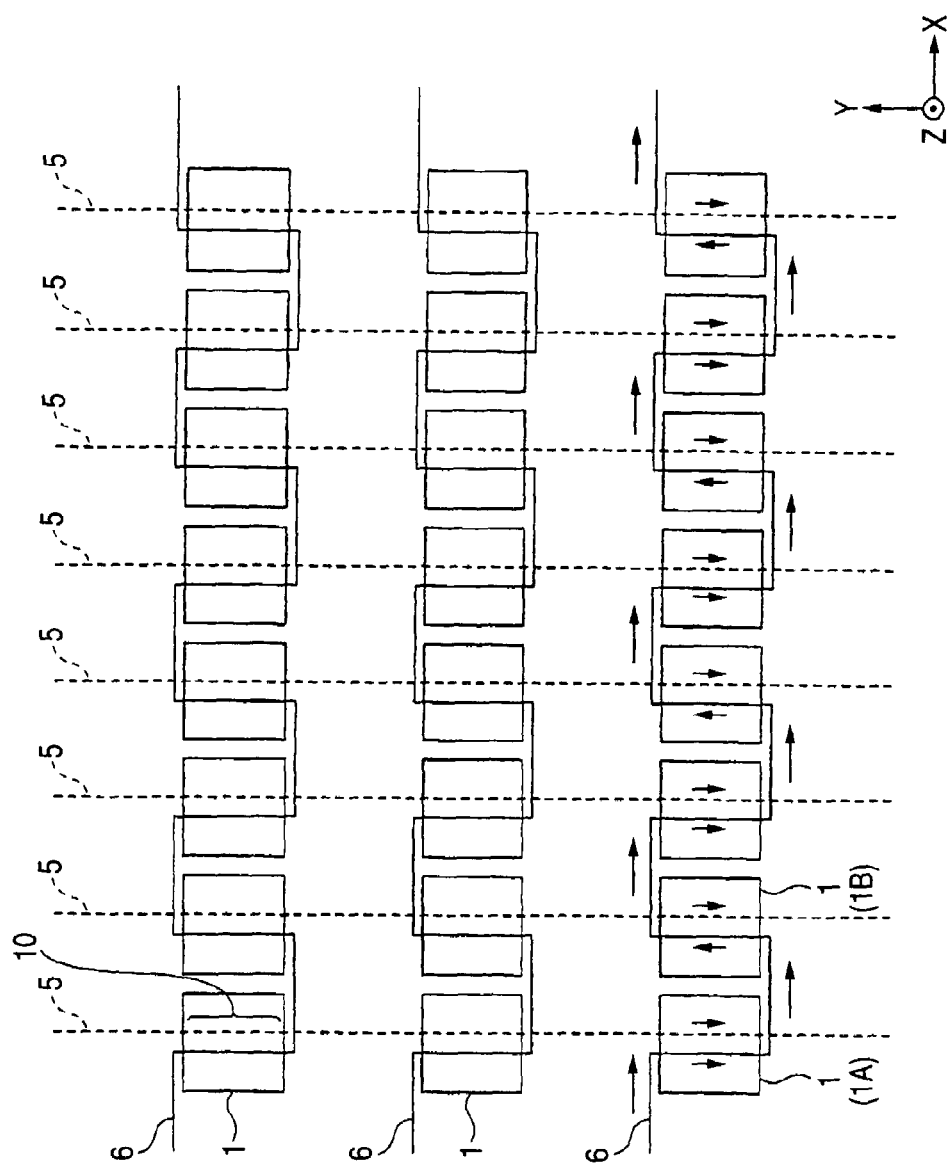
FIG. 2 is a plane view showing a constitution of a write line of the magnetic memory device shown in FIG. 1.

FIG. 2 conceptually shows a positional relationship among pluralities of the write bit lines 5, the write word lines 6 and the memory cells 1 in the memory cell group 54. As shown by FIG. 2, the write word line 6 on one side is extended in a shape of a rectangular wave and the write bit line 5 on other side is linearly extended. Rise portions and fall portions in the shape of the rectangular wave in the write word line 6 form a plurality of parallel portions 10 along with the write bit line 5. The memory cell 1 is provided at a region of intersecting the write bit line 5 and the write word line 6 to surround at least a portion of each parallel portion 10. Here, provision of the memory cell 1 at the intersected region includes also a case of providing the memory cell 1 contiguous to the intersection point. Current respectively from the current drive circuits 56C and 58C flows to the write bit line 5 and the write word line 6. A description will be given later of operation of writing to the memory cell 1 using the write bit line 5 and the write word line 6.

Next, an explanation will be given of a circuit constitution with regard to reading operation in the magnetic memory device according to the embodiment in reference to FIG. 3.

Figure 3:
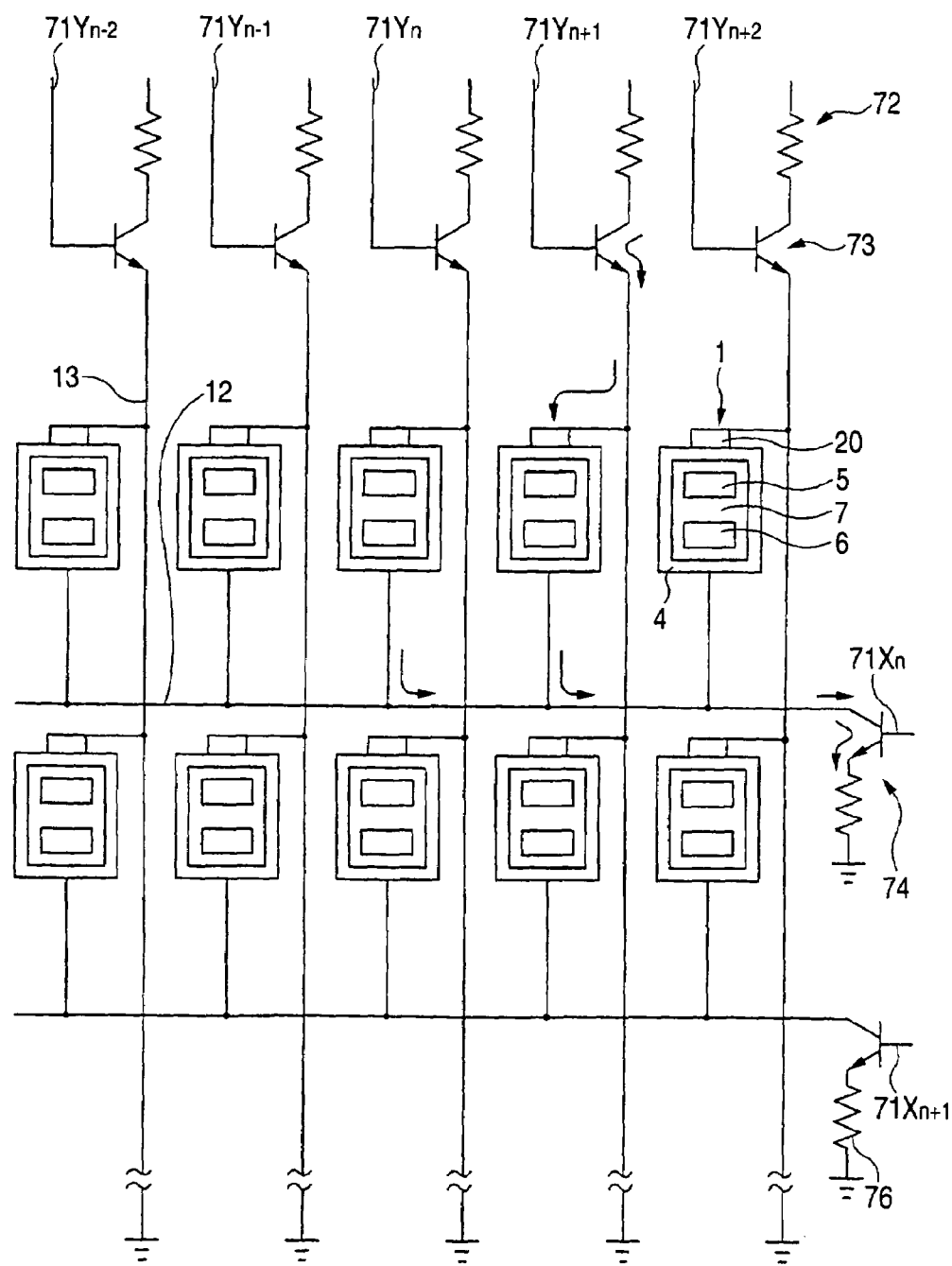
FIG. 3 is a circuit diagram showing a circuit constitution of the magnetic memory device shown in FIG. 1.

FIG. 3 shows an essential circuit constitution of a portion with regard to reading operation. In the memory cell group 54, a plurality of read word lines 12 extended in X direction and aligned in Y direction at equal intervals and a plurality of read bit lines 13 extended in Y direction and aligned in X direction at equal intervals are arranged in a shape of a lattice orthogonally to each other. The plurality of memory cells 1 are arranged at equal intervals at respective regions at which the read word lines 12 and the read bit lines 13 are orthogonally intersected. One end of each of the memory cells 1 is respectively connected to the read word line 12 and other end thereof is respectively connected to the read bit line 13.

Each of the memory cells 1 is formed with a TMR element 20. Either state of a high resistance state or a low resistance state is selected for the TMR element 20 in accordance with magnetizing directions of two of ferromagnetic layers at inside thereof. A description will be given later of details of the memory cells 1.

One end of the read word line 12 is respectively connected with a word line selecting switch 74. The word line selecting switch 74 is connected to the word decode line 71X and also connected to a current limiting resistor 76 to select either thereof. The current limiting resistor 76 is provided with a function of adjusting a magnitude of read current and an end portion thereof on a side opposed to the word line selecting switch 74 is grounded. One end of the read bit line 13 is respectively connected to a bit line selecting switch 73 and other end thereof is respectively grounded. The bit line selecting switch 73 is connected to the bit decode line 71Y and also connected to a current to voltage converting resistor 72 to select either thereof. The current to voltage converting resistor 72 functions to take out read current as a change in voltage.

According to the magnetic memory device having such a circuit constitution, read current is made to flow in a direction orthogonal to a laminated layer face of a laminated body including a first magnetic layer 2, a magnetosensitive layer constituted as a portion of a annular magnetic layer 4 and a tunnel barrier layer 3 and information is read by detecting a magnetizing direction of the annular magnetic layer 4 based on the read current. The annular magnetic layer 4 is constituted such that a hole opening direction when attention is paid to a single one of the annular magnetic layer 4, that is, an axial direction of the annular magnetic layer 4 becomes a direction along the laminated layer face of the TMR element 20 which is the laminated member as shown by FIG. 7, mentioned later. The constitution of the annular magnetic layer 4 stays the same also in other embodiments, modified examples and examples, mentioned later. Specific reading operation will be described later.

An explanation will be given to a detailed constitution of the magnetic memory device in reference to FIG. 4 through FIG. 7(A).

Figure 4:
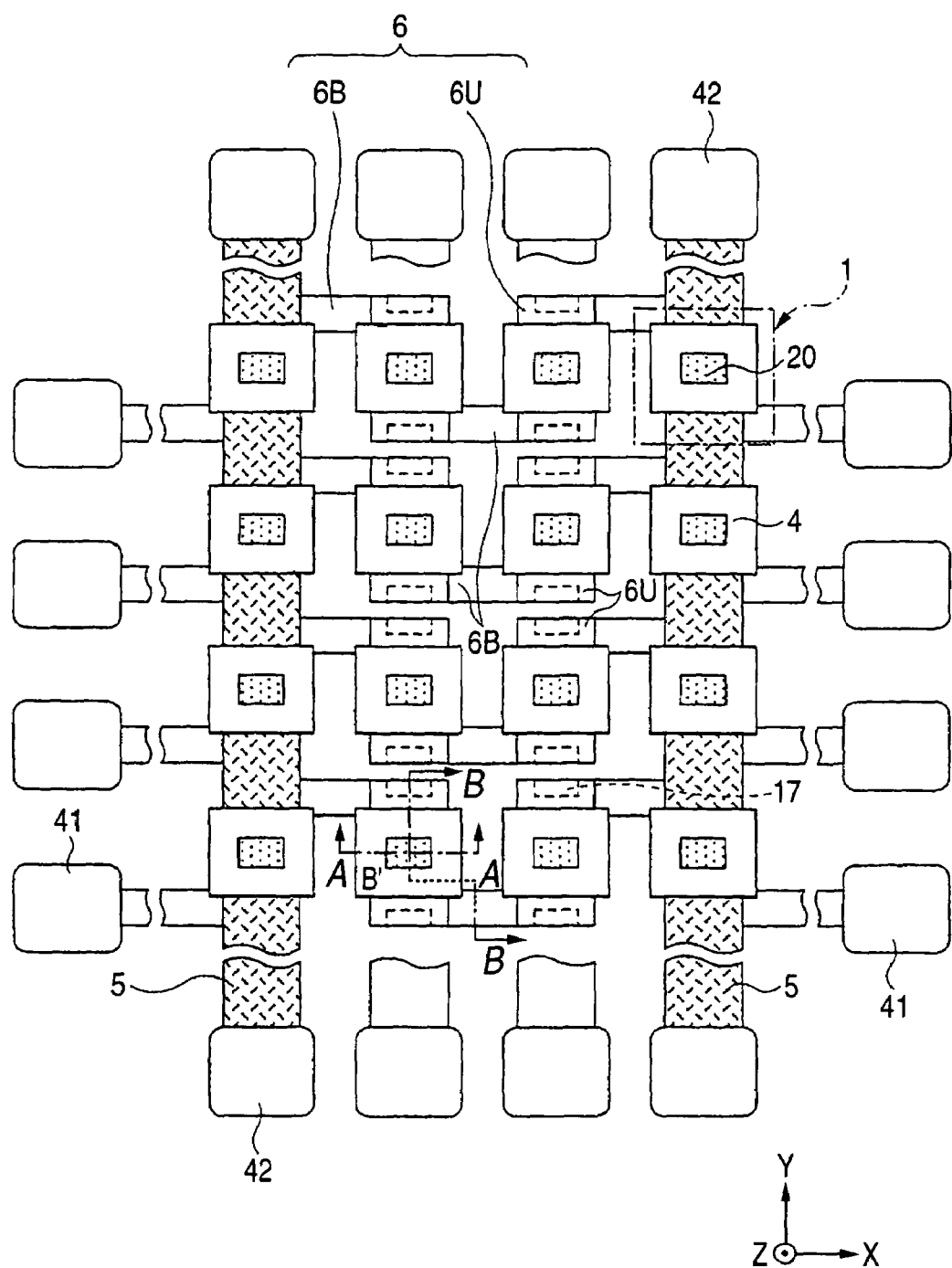
FIG. 4 is a partial plane view showing a constitution of an essential portion of a memory cell group of the magnetic memory device shown in FIG. 1.
Figure 5:
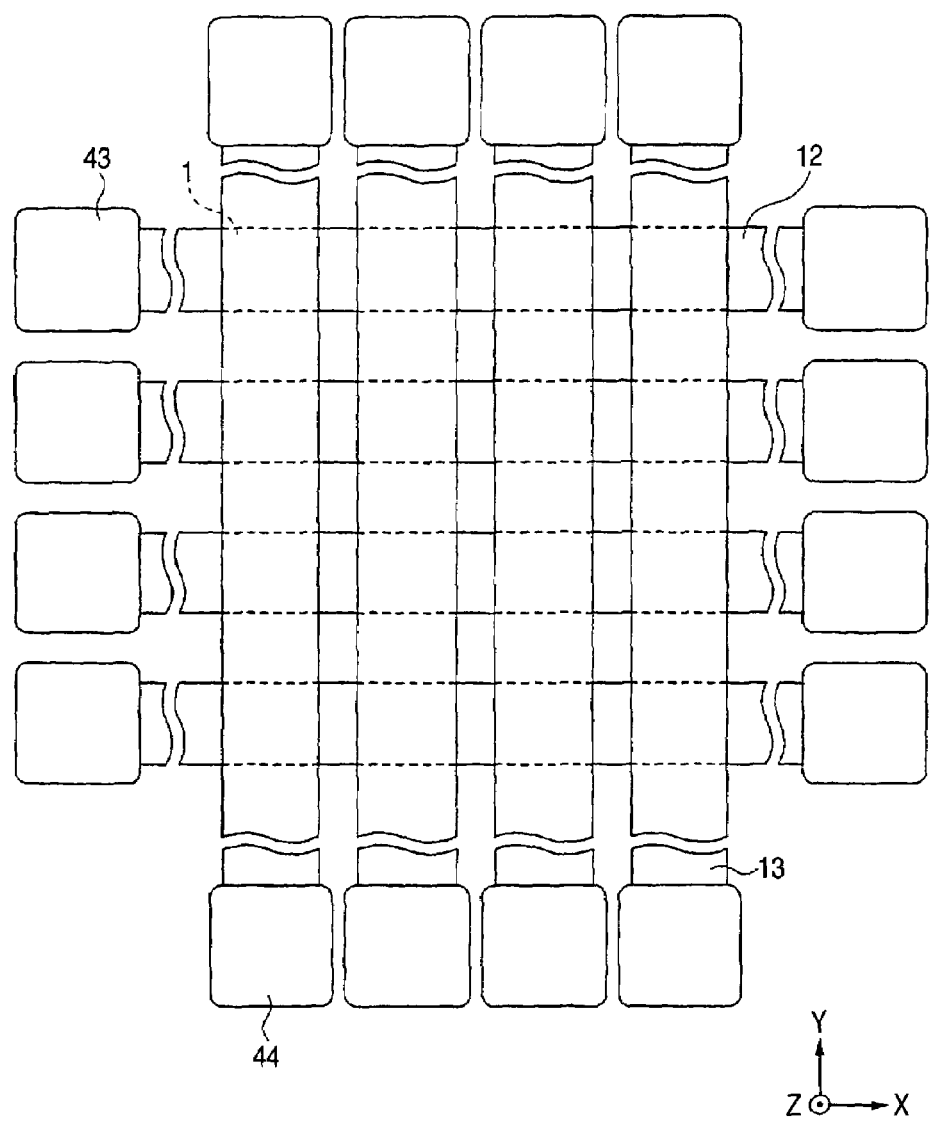
FIG. 5 is other partial plane view showing the constitution of the essential portion of the memory cell group of the magnetic memory device shown in FIG. 1.
Figure 6:
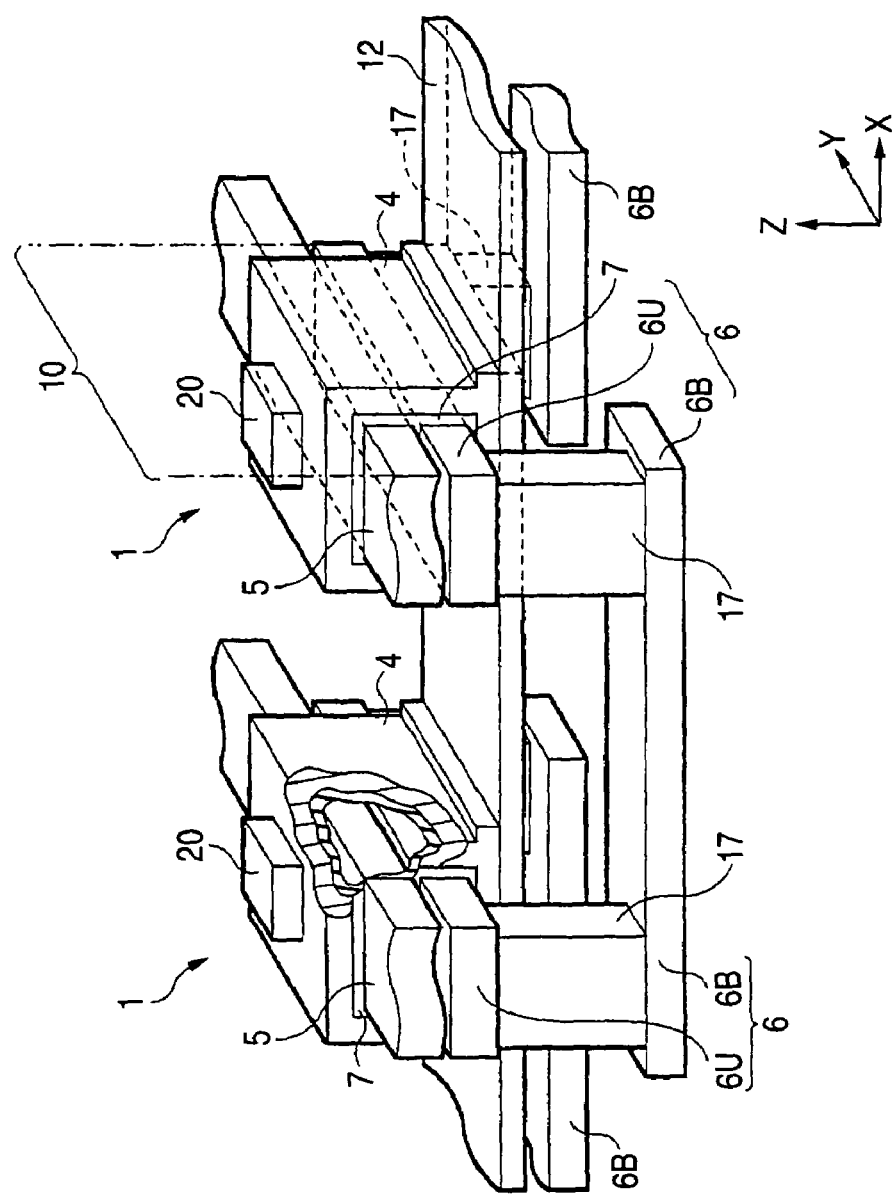
FIG. 6 is a perspective view of essential portions showing a constitution of an essential portion of the memory cell group of the magnetic memory device shown in FIG. 1.
Figure 7A:
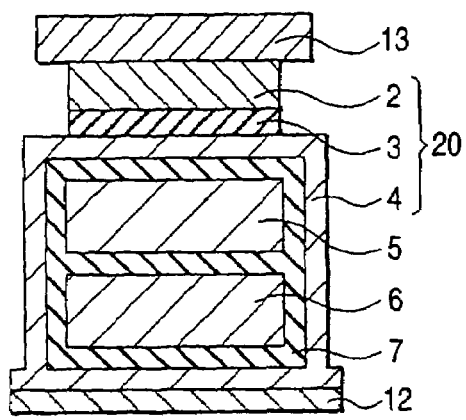
FIGS. 7A to 7C illustrate sectional views showing a constitution of a cut face along a line A—A of a memory cell shown in FIG. 4.

FIG. 4 and FIG. 5 show a planar constitution of an essential portion of the memory cell group 54. The write bit line 5, the write word line 6 and the memory cell 1 shown in FIG. 4 are in correspondence with FIG. 2. FIG. 6 is an enlarged perspective view of the memory cell 1. FIG. 7A is a sectional view showing a constitution of a face cut along a line A—A of the memory cell 1 shown in FIG. 4.

As shown by FIG. 4, the magnetic memory device according to the embodiment includes a plurality of the write bit lines 5 and a plurality of the write word lines 6 extended to respectively intersect with the plurality of write bit lines 5. The magnetic memory device is constituted to include the parallel portion 10 at which the write bit line 5 and the write word line 6 are extended in parallel with each other at the region of intersecting the write bit line 5 and the write word line 6. Further, the TMR element 20 is arranged at the parallel portion 10 and information is stored by changing the magnetizing direction of the annular magnetic layer 4 constituting a portion of the TMR element 20 by a magnetic field generated by current flowing at both of the write bit line 5 and the write word line 6 in the parallel portion 10 (that is, external magnetic field at the annular magnetic layer 4).

Specifically, as shown by FIG. 4, the plurality of write bit line 5 in a linear shape extended in Y direction are aligned at equal intervals in X direction and the write word line 6 extended in the shape of the rectangular wave in XY plane are formed to respectively intersect with the plurality of write bit line 5. The rise portion and the fall portion of the shape of the rectangular wave of the write word line 6 and the write bit line form the parallel portion 10. At the parallel portion 10, the write bit line 5 and the write word line 6 are formed at positions coinciding with each other in XY plane and the write bit line 5 and the write word line 6 are constituted at a constant interval therebetween in Z axis direction. Further, FIG. 4 is illustrated by omitting portions of the write bit line 5 to make the shape of the write word line 6 easy to see.

Further, as shown by FIG. 6, the write word line 6 includes two layer portions formed at faces different from each other in Z direction, that is, an upper write word line 6U and a lower write bit line 6B which are respectively connected to each other via an interlayer connecting layer 17 comprising a conductive material of, for example, aluminum (Al) or the like. The interlayer connecting layer 17 is a specific example of "interlayer conducting layer" according to the invention. Further, in FIG. 6, illustration of the read word line 13 is omitted.

Both ends of the plurality of write bit line 5 are respectively provided with write bit line drawout electrodes 42. One of the write bit line drawout electrodes 42 is connected to the current drive circuit 56C and other thereof is connected to be finally grounded, respectively. Similarly, both ends of the plurality of write word line 6 are respectively provided with write word line drawout electrodes 41. One of the write word line drawout electrodes 41 is connected to the current drive circuit 58C and other thereof is connected to be finally grounded, respectively.

The memory cells 1 arranged as shown by FIG. 4 are arranged at respective intersection points of the plurality of read word lines 12 and the plurality of read bit lines 13 in XY plane. Here, an upper face of the memory cell 1 (on a side of the TMR element 20) is brought into contact with the read bit line 13 and a lower face (on a side opposed to the TMR element 20) thereof is brought into contact with the read word line 12.

FIG. 7A shows a sectional constitution at A—A cut line of the memory cell 1 shown in FIG. 4 and FIG. 6.

As shown by FIG. 7A, the memory cell 1 includes the TMR element 20, the write bit line 5, the write word line 6 and an insulating film 7 and formed to be interposed between the read word line 12 and the read bit line 13. The TMR element 20 is provided with the annular magnetic layer 4 formed in a annular shape and constituted to be penetrated by a plurality of lead wires and a laminated body including a magnetosensitive layer constituted as a portion of the annular magnetic layer 4 and constituted to make current flow in a direction orthogonal to a laminated layer face thereof. Specifically, according to the TMR element 20, the laminated body includes the tunnel barrier layer 3, the first magnetic layer 2 laminated on one side of the tunnel barrier 3 and having a fixed magnetizing direction, and a portion of the annular magnetic layer 4 laminated on a side of the tunnel barrier layer 3 opposed to the first magnetic layer 2 and functioning as the magnetosensitive layer the magnetizing direction of which is changed by an external magnetic field and the magnetizing direction of the annular magnetic layer 4 as the magnetosensitive layer is detected based on current flowing in a direction orthogonal to the laminated layer face of the laminated body.

According to the TMR element 20, when voltage is applied between the first magnetic layer 2 and the annular magnetic layer (magnetosensitive layer) 4 in the direction orthogonal to the laminate layer face, electrons are moved to the annular magnetic layer (magnetosensitive layer) 4 by penetrating the tunnel barrier layer 3 to thereby make tunnel current flow. The tunnel current is changed by a relative angle between spin of the first magnetic layer 2 and spin of the annular magnetic layer (magnetosensitive layer) 4 at interface portions thereof with the tunnel barrier layer 3. That is, when the spin of the first magnetic layer 2 and the spin of the annular magnetic layer (magnetosensitive layer) 4 are in parallel and same direction with each other, the resistance value is minimized and when the spins are in parallel and opposite direction with each other, the resistance value is maximized. A magnetoresistance change rate (MR ratio) is defined as shown by Equation (1) by using the resistance values.

$$(MR\ \text{ratio}) = dR/R \qquad (1)$$

Here, "dR" designates a difference between the resistance values when the spins are in parallel and same direction with each other and when the spins are not in parallel with each other and "R" designates the resistance value when the spins are in parallel and opposite direction with each other.

The resistance value against the tunnel current (hereinafter, referred to as tunnel resistance Rt) strongly depend on a film thickness T of the tunnel barrier layer 3. As shown by Equation (2), at a low voltage region, the tunnel resistance Rt is increased exponentially relative to the film thickness T of the tunnel barrier layer 3.

$$Rt \propto \exp(2x^T), x = \{8\pi^2 m^*(\phi^{0.5})\}/h \qquad (2)$$

Here, "$\phi$" designates a barrier height, "$m^*$" designates an effective mass of an electron, "Ef" designates Fermi energy and h designates the Planck constant. Generally, according to the memory element using the TMR element, in order to achieve matching with a semiconductor device of a transistor or the like, the tunnel resistance Rt is regarded to be pertinent to be about several tens $k\Omega \cdot (\mu m)^2$. However, in order to achieve high density formation and high speed formation of operation of the magnetic memory device, the tunnel resistance Rt is preferably equal to or smaller than 10 $k\Omega \cdot (\mu m)^2$, further preferably 1 $k\Omega \cdot (\mu m)^2$. Therefore, in order to realize the above described tunnel resistance Rt, the thickness T of the tunnel barrier layer 3 is preferably equal to or smaller than 2 nm, further preferably equal to or smaller than 1.5 nm.

While the tunnel resistance Rt can be reduced by thinning the thickness T of the tunnel barrier layer 3, the MR ratio is reduced since leakage current caused by recesses and projections at a junction interface of the first magnetic layer 2 and the annular magnetic layer (magnetosensitive layer) 4 is produced. In order to prevent the leakage, the thickness T of the tunnel barrier layer 3 needs to be a thickness to a degree by which the leakage current does not flow, specifically, the thickness T is preferably a thickness equal to or larger than 0.3 nm.

TMR element 20 shown in FIG. 7A is provided with the coercive force difference type structure and it is preferable that the coercive force of the first magnetic layer 2 is constituted to be larger than the coercive force of the annular magnetic layer (magnetosensitive layer) 4. Specifically, the coercive force of the first magnetic layer 2 is preferably larger than $(50/4\pi) \times 10^3$ A/m, particularly preferably $(100/4\pi) \times 10^3$ A/m. Thereby, the magnetizing direction in the fist magnetic layer 2 can be prevented from being effected with influence of unnecessary magnetic field of an external disturbance magnetic field or the like. The first magnetic layer 2 comprises a cobalt iron alloy (CoFe) having a thickness of, for example, 5 nm. Otherwise, a single substance of cobalt (Co), a cobalt platinum alloy (CoPt), a nickel iron cobalt alloy (NiFeCo) or the like is applicable to the first magnetic layer 2. Further, it is preferable that the easy magnetization axes of the first magnetic layer 12 and the annular magnetic layer 4 (magnetosensitive layer) are set in parallel with each other to stabilize in a state in which the magnetizing directions of the first magnetic layer 2 and the annular magnetic layer 4 (magnetosensitive layer) are in parallel and same direction with each other or are in parallel and opposite direction with each other.

The annular magnetic layer (magnetosensitive layer) 4 is extended to surround at least a portion of the parallel portion 10 in the write bit line 5 and the write word line 6, that is, a region penetrating the annular magnetic layer (magnetosensitive layer) 4 and is constituted such that a circulating current magnetic field is generated at inside of the annular magnetic layer 4 by current flowing at the parallel portion 10. The annular magnetic layer 4 is a storage layer for storing information and information is stored by inverting the magnetizing direction of the annular magnetic layer 4 by the circulating current magnetic field. The annular magnetic layer 4 comprises, for example, a nickel-iron alloy (NiFe) and a thickness thereof in a sectional direction at the portion of the magnetosensitive layer constituting a portion of the TMR element 20 is 20 nm. Further, it is preferable that the coercive force of the annular magnetic layer 4 falls in a range equal to or larger than $(50/4\pi) \times 10^3$ A/m and equal to or smaller than $(100/4\pi) \times 10^3$ A/m and is constituted to be smaller than the coercive force of the first magnetic layer 2. Because when the coercive force is less than $(50/4\pi) \times 10^3$ A/m, the magnetizing direction in the annular magnetic layer 4 may be disturbed by unnecessary magnetic field of an external disturbance magnetic field or the like. Because on the other hand, when the coercive force exceeds $(100/4\pi) \times 10^3$ A/m, there is a possibility that the TMR element per se is deteriorated by heat generation caused by an increase in write current. Further, the permeability of the annular magnetic layer 4 may preferably be larger to concentrate the current magnetic field by the write bit line 5 and the write word line 6 on the annular magnetic layer 6. Specifically, the permeability is equal to or larger than 2000, further preferably equal to or larger than 6000.

Each of the write bit line 5 and the write word line 6 is constructed by a structure of successively laminating a layer of titanium having a thickness of 10 nm, a layer of titanium nitride (TiN) having a thickness of 10 nm and a layer of aluminum (Al) having a thickness of 500 nm and the write bit line 5 and the write word line 6 are electrically insulated from each other by the insulating film 7. The write bit line 5 and the write word line 6 may comprise at least one kind of aluminum (Al), copper (Cu) and tungsten (W).

Next, an explanation will be given of operation of the magnetic memory device according to the embodiment.

Figure 7B:
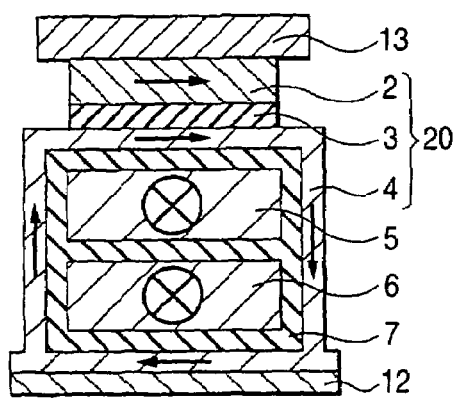
Figure 7C:
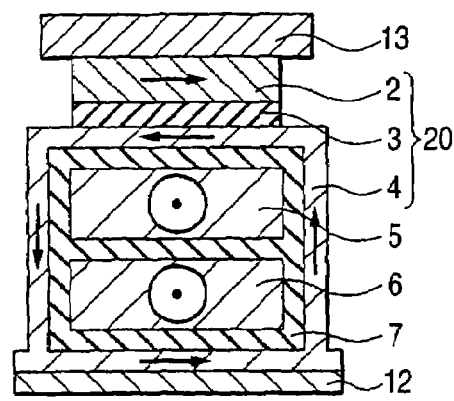
Figure 8A:
FIGS. 8A and 8B illustrate enlarged sectional views showing a step in a method of fabricating the magnetic memory device shown in FIG. 1.
Figure 8B:
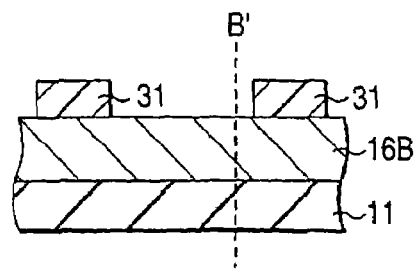

First, writing operation at the memory cell 1 will be explained in reference to FIGS. 7B and 7C. FIGS. 7B and 7C show a section at the A—A cut line of the memory cell 1 shown in FIG. 4 and FIG. 6, showing a relationship between a current direction and a magnetizing direction.

FIGS. 7B and 7C show a case in which write current flows to the write bit line 5 and the write word line 6 in parallel with each other passing the memory cell 1 in directions the same as each other in correspondence with a state of the memory cell 1A in FIG. 2. FIG. 7B shows a case in which write current flows in a direction orthogonal to the paper face from this side to the depth side (to Y direction) and a recirculating current magnetic field is generated in the clockwise direction at inside of the annular magnetic layer 4. Meanwhile, FIG. 7C shows a case in which write current flows in a direction orthogonal to the paper face from the depth side to this side (to −Y direction) and a recirculating current magnetic field is generated in the counterclockwise direction at inside of the annular magnetic layer (magnetosensitive layer) 4. When current flows at the write bit line 5 and the write word line 6 in the same directions in this way, the magnetizing direction of the annular magnetic layer 4 is inverted to record 0 or 1. For example, when the state of FIG. 7B is set to 0, the state of FIG. 7C is identified as 1. Here, when write current flows in directions reverse to each other as in a state of the memory cell 1B shown in FIG. 2, or when write current flows only at either one thereof, the magnetized direction of the annular magnetic layer 4 is not inverted and data is not rewritten.

Next, reading operation of the magnetic memory device will be explained in reference to FIG. 1 and FIG. 3. First, one of the plurality of bit decode lines 71Y is selected by the address decoder circuit 56 A at the first drive control circuit portion 56 to drive the bit line selecting switch 73 at the corresponding portion. The selected bit line selecting switch 73 is brought into a conductive state, read current flows at the read bit lint 13 and positive potential is provided to the memory cell 1 on the side of the TMR element 20. Similarly, one of the plurality of word decode lines 71X is selected by the address decoder circuit 58A in the second drive control circuit portion 58 to drive the word line selecting switch 74 of the corresponding portion. The selected word line selecting switch 74 is brought into a conductive state, read current flows to the read word line 12 and negative potential is provided to the memory cell 1 on the side opposed to the TMR element 20. Therefore, read current necessary for reading can be made to flow to a single one of the memory cell 1 selected by the address decoder circuit 56A and the address decoder circuit 58A. Stored information can be read by detecting the magnetizing direction of the annular magnetic layer (magnetosensitive layer) 4 based on the read current.

According to the magnetic memory device of the embodiment, by the above-described constitution, there is provided the laminated body formed in the annular shape, including the annular magnetic layer (magnetosensitive layer) 4 constituted to be penetrated by the write bit line 5 and the write word line 6 and constituted to make current flow in the direction orthogonal to the laminated layer face and therefore, the closed magnetic path can be formed by making current flow to both of the write bit line 5 and the write word line 6, conversion of magnetization at the annular magnetic layer (magnetosensitive layer) 4 of the TMR element 20 can efficiently be carried out, and magnetic influence can be reduced to effect on a memory cell contiguous to a memory cell constituting an object of writing. Further, the write bit line 5 and the write word line 6 are constituted to extend in parallel with each other at a region penetrating the annular magnetic layer (magnetosensitive layer) 4 and therefore, a synthesized magnetic field generated at the annular magnetic layer (magnetosensitive layer) 4 by making current flow to the write bit line 5 and the write word line 6 can be made to be larger than that in the case of intersecting the write lines with each other and inversion of magnetization at the annular magnetic layer (magnetosensitive layer) 4 can be carried out further efficiently.

Next, an explanation will be given of a method of fabricating a magnetic memory device according to the embodiment having the above-described constitution.

A method of fabricating a magnetic memory device according to the invention includes a step of forming the upper write word line 6U on an insulating film 7B, a step of forming an insulating film 7C to cover a region of the upper write word line 6U in correspondence with the parallel portion 10 and a surrounding thereof and thereafter flattening a surface thereof, a step of forming the write bit line 5 on the flattened insulating film 7C and a step of self-adjustingly forming a laminated layer structure 19 at the parallel portion 10 of the write bit line 5 and the upper write word line 6U by selectively etching to remove the insulating film 7C by constituting a mask by the write bit line 5. A specific explanation thereof will be given as follows.

A detailed explanation will be given of a method of mainly forming the memory cells 1 of the magnetic memory device in reference to FIG. 8 through FIG. 23. Further, FIG. 8A through FIG. 23A show a sectional constitution along the A—A cut line shown in FIG. 4 and FIG. 8B through FIG. 23B show a sectional constitution along a B—B cut line shown in FIG. 4.

Figure 9A:
FIGS. 9A and 9B illustrate enlarged sectional views showing a step successive to FIG. 8.
Figure 9B:
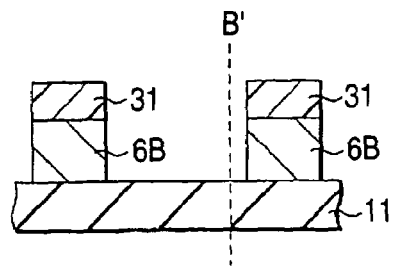
Figure 10A:
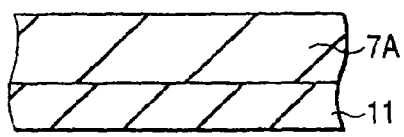
FIGS. 10A and 10B illustrate enlarged sectional views showing a step successive to FIGS. 9A and 9B.
Figure 10A:
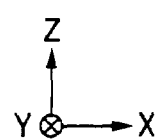
Figure 10B:
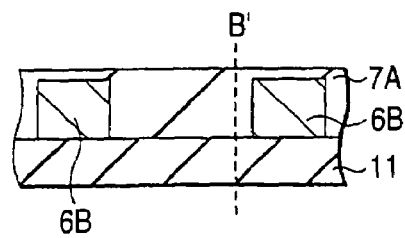
Figure 10B:
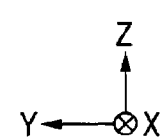

First, as shown by FIG. 8, a board 11 comprising silicon (Si) is prepared and a multilayer film 16B is formed by laminating layers of titanium (Ti), titanium nitride (TiN) and aluminum (Al) in this order above the board 11 by using the sputtering apparatus or the like. Next, a predetermined resist is coated over an entire face thereof and a resist pattern having a predetermined shape is formed by using an i radiation reduction stepper or the like. By constituting a mask by the resist pattern 31, reactive ion etching (RIE) is selectively carried out by using boron trichloride ($BCl_3$) as a reactive gas. Thereby, as shown by FIG. 9, the lower write word line 6B having a predetermined shape is formed. In this case, the lower write word line 6B is formed such that a width thereof along X direction becomes, for example, 700 nm.

Next, as shown by FIG. 10, an insulating film 7A comprising, for example, silicon oxide ($SiO_2$) is formed to cover the total by a CVD (chemical Vapor Deposition) apparatus by using, for example, TEOS (tetraethylorthosilicate; $Si(OC_2H_5)_4$). Thereafter, the surface of the insulating film 7A is flattened by, for example, a CMP (Chemical Mechanical Polishing) apparatus.

Figure 11A:
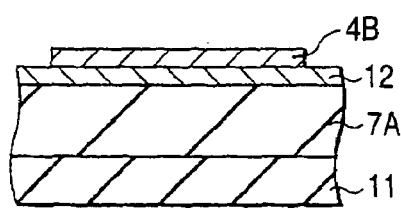
FIGS. 11A and 11B illustrate enlarged sectional views showing a step successive to FIGS. 10A and 10B.
Figure 11B:
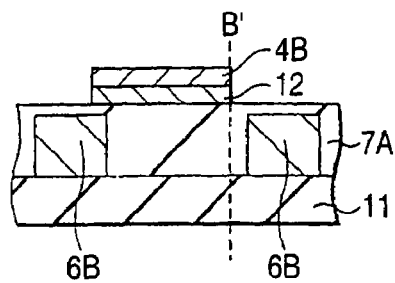

Thereafter, as shown by FIG. 11, the read word line 12 and a bottom annular magnetic layer 4B are successively formed selectively at a region in correspondence with at least a portion of the parallel portion 10 of the write bit line 5 and the write word line 6. Here, the bottom annular magnetic layer 4B is a specific example in correspondence with "first annular magnetic layer portion" according to the invention. Specifically, first, above the insulating film 7A, titanium (Ti) TiN and aluminum (Al) are formed in this order by a sputtering apparatus or the like and thereafter, a multilayer film (not illustrated) for constituting the read word line 12 later is formed. Thereafter, a resist is coated to cover the total and a resist pattern (not illustrated) is formed by using the i radiation stepper. By patterning the multilayer film by carrying out an RIE treatment or the like by utilizing the resist pattern, the read word line 12 is formed. Successively, a resist pattern (not illustrated) is formed by using the i radiation stepper to dip in a plating tank of, for example, iron sulfate ($FeSO_4$) and nickel sulfate ($NiSO_4$) and conduct electricity, a plated film (not illustrated) comprising a nickel iron alloy (atomic ratio; Ni:Fe=80:20) is formed. Thereafter, by patterning the plated film (not illustrated), the bottom annular magnetic layer 4B is formed.

Figure 12A:
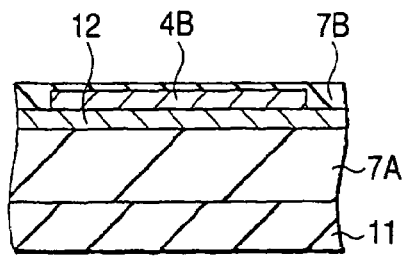
FIGS. 12A and 12B illustrate enlarged sectional views showing a step successive to FIGS. 11A and 11B.
Figure 12B:
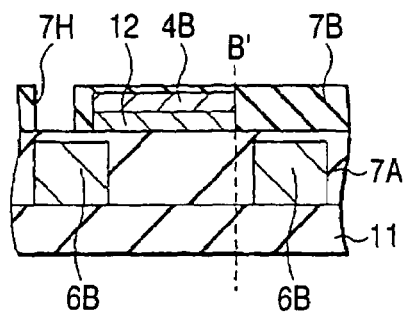

After forming the read word line 12 and the bottom annular magnetic layer 4B, as shown by FIGS. 12A and 12B, an insulating film 7B is formed over the entire face by a CVD apparatus by using TEOS and the surface of the insulating film 7B is flattened by a CMP apparatus. Further, a via hole 7H for connecting the upper write word line 6U and the lower write word line 6B is formed (refer to FIG. 12B). In this case, the via hole 7H is formed by coating a resist on the insulating film 7B, forming a resist pattern by, for example, the i radiation stepper and thereafter carrying out RIE using $C_4F_8$ as a reactive gas.

Figure 13A:
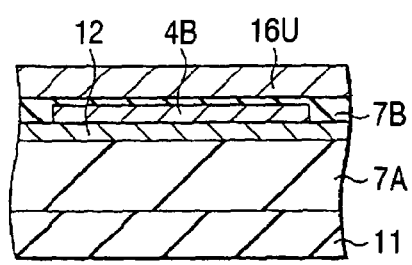
FIGS. 13A and 13B illustrate enlarged sectional views showing a step successive to FIGS. 12A and 12B.
Figure 13B:
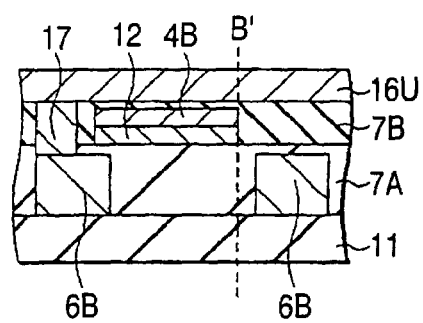
Figure 13B:
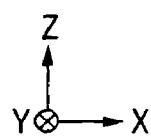
Figure 13B:
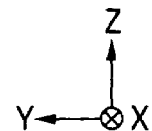

Successively, the interlayer connecting layer 17 as shown by FIG. 13B is formed by embedding a conductive material of, for example, aluminum (Al) or the like to the via hole 7H by using an LTS (Long Throw Sputtering) apparatus or the like. The interlayer connecting layer 17 functions to electrically connect the upper write line 6U and the lower write word line 6B. After forming the interlayer connecting layer 17, a metal multilayer film 16U comprising, for example, titanium (Ti), titanium nitride (TiN) and aluminum (Al) is formed over the entire face as shown by FIGS. 13A and 13B.

Figure 14A:
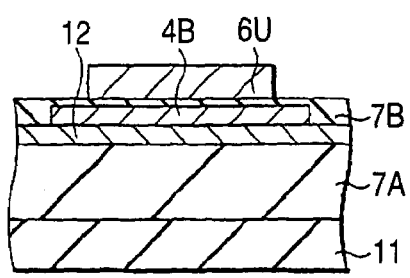
FIGS. 14A and 14B illustrate enlarged sectional views showing a step successive to FIGS. 13A and 13B.
Figure 14B:
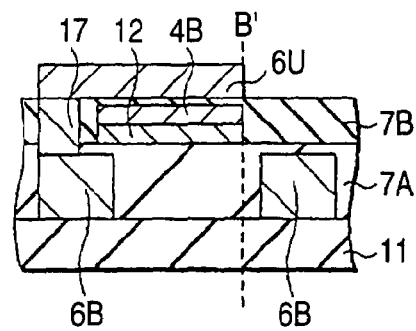

After forming a resist pattern (not illustrated) over the entire face of the metal multilayer film 16U by the i radiation stepper, the metal multilayer film 16U is patterned by carrying out the RIE treatment by utilizing the resist pattern as a mask. Thereby, as shown by FIGS. 14A and 14B, the upper write word line 6U is formed at a region in correspondence with the parallel portion 10. In this case, it is important to form an end portion thereof to be connected to an upper portion of the interlayer connecting layer 17 and form the metal multilayer film 16U to be slightly wider than a width in X direction of the write bit line 5 to be formed at a later step.

Figure 15A:
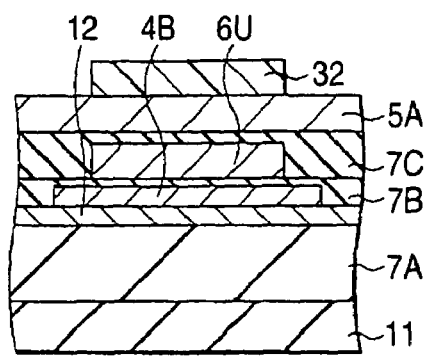
FIGS. 15A and 15B illustrate enlarged sectional views showing a step successive to FIGS. 14A and 14B.
Figure 15B:
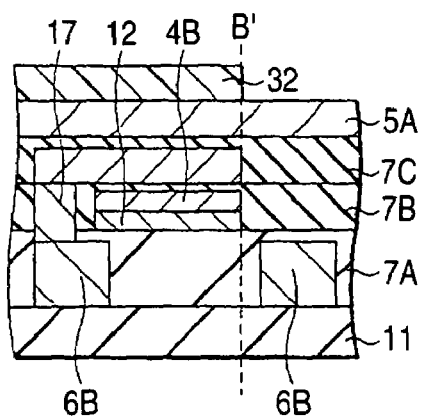

After forming the upper write word line 6U, as shown by FIGS. 15A and 15B, an insulating film 7C is formed over the entire face by the CVD apparatus by using TEOS and the surface of the insulating film 7C is flattened by the CMP apparatus. A multiplayer film 5A for constituting the write bit line 5 later is formed by forming films of titanium (Ti), TiN and aluminum (Al) in this order on the flattened insulating film 7C by using the sputtering apparatus or the like. Further, after coating a resist on the multilayer film 5A, a resist pattern 32 is formed selectively by the i radiation stepper.

The multilayer film 5A is patterned by utilizing the resist pattern 32 as a mask and carrying out the RIE treatment using, for example, $BCl_3$ gas as a reactive gas. Thereby, the write bit line 5 is formed.

Figure 17A:
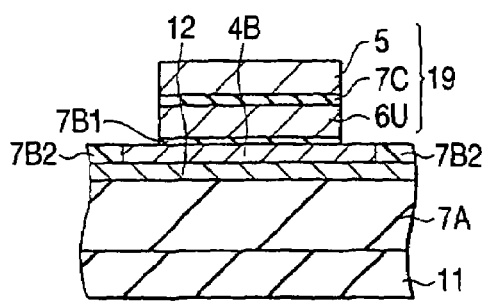
FIGS. 17A and 17B illustrate enlarged sectional views showing a step successive to FIG. 16A and 16B.
Figure 17A:
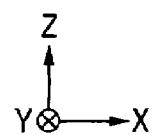
Figure 17B:
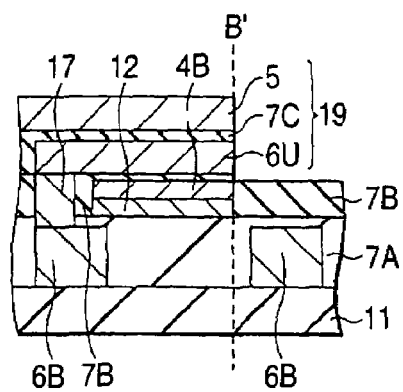
Figure 17B:
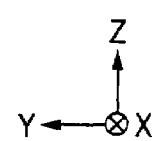

Next, as shown by FIGS. 17A and 17B, a laminated layer structure 19 is self-adjustingly formed by constituting a mask by the write bit line 5. Specifically, the laminated layer structure 19 is formed by removing all of a region of the insulating film 7C which is not protected by the write bit line 5 and portions in a thickness direction of the insulating film 7B and the upper write word line 6U by RIE and ion milling using $C_4F_8$ as a reactive gas. Here, it is important to remove the insulating film 7B until the bottom annular magnetic layer 4B is exposed. Thereby, the write word line 6 in which the lower write word line 6B and the upper write word line 6U are connected by the interlayer connecting layer 17 is tentatively finished. In this case, the write word line 6 may be formed by being curved not only in a film face direction but also in the laminating direction by connecting a non-parallel portion of the write word line 6 and the parallel portion 10 by the interlayer connecting layer 17. Thereby, the memory cell 1 can be formed on XY plane at a smaller region.

By forming the laminated layer structure 19 self-adjustingly by constituting the mask by the write bit line 5 in this way, the upper write word line 6U having a width the same as that of the write bit line 5 can highly accurately be formed. Further, a step of forming the resist pattern and a step of removing the resist pattern and the like can be omitted and the fabricating steps can be simplified.

Figure 18A:
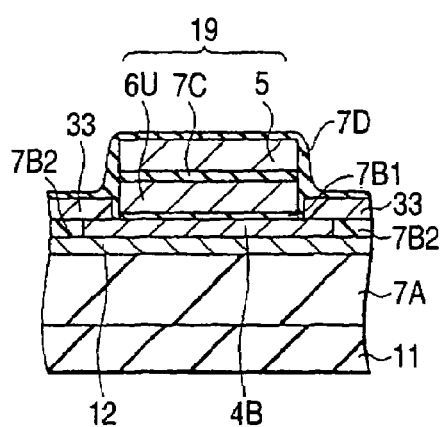
FIGS. 18A and 18B illustrate enlarged sectional views showing a step successive to FIG. 17A and 17B.
Figure 18B:
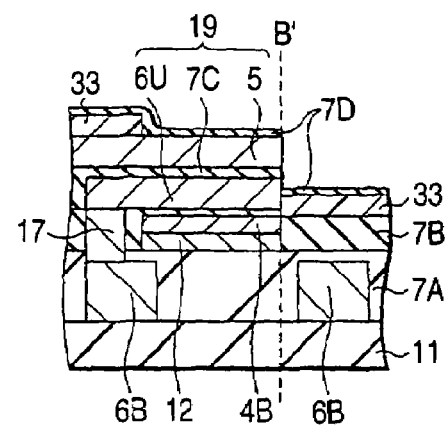

After forming the laminated layer structure 19 at the parallel portion 10 of the write bit line 5 and the write word line 6, as shown by FIGS. 18A and 18B, an insulating film 7D comprising, for example, $SiO_2$ is formed to cover a side face and an upper face of the laminated layer structure 19. Specifically, after forming a resist pattern 33 selectively at a region excluding at least the laminated structure 19 at the cut face along the line A—A by the i radiation stepper or the like, the insulating film 7D is formed over the entire face by the CVD apparatus or the like by using TEOS.

Next, formation of the annular magnetic layer 4 comprising the bottom annular magnetic layer 4B and the upper annular magnetic layer 4U is finished by selectively covering the side face and the upper face of the insulating film 7D and forming the upper annular magnetic layer 4U to be connected to the bottom annular magnetic layer 4B. Here, the upper annular magnetic layer 4U is a specific example in correspondence with "first annular magnetic layer portion" according to the invention, further, the bottom annular magnetic layer 4B is a specific example in correspondence with "second annular magnetic layer portion" according to the invention.

Figure 19A:
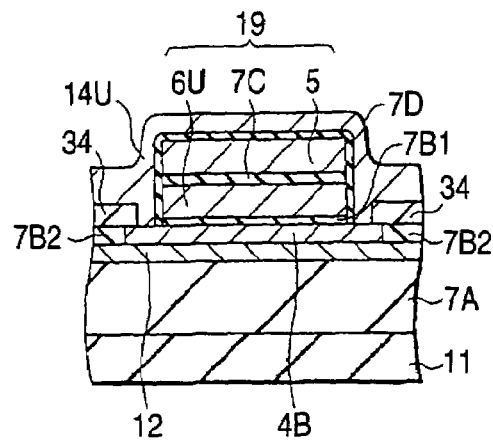
FIGS. 19A and 19B illustrate enlarged sectional views showing a step successive to FIGS. 18A and 18B.
Figure 19B:
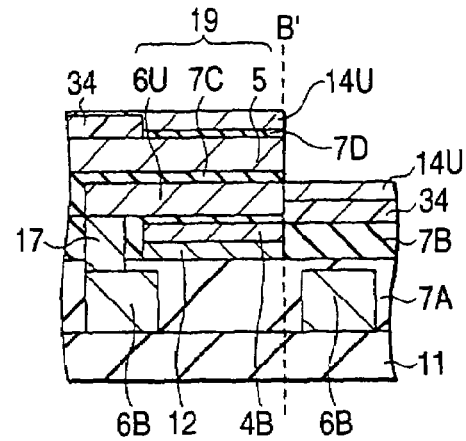

Specifically, as shown by FIGS. 19A and 19B, after removing the resist pattern 33 by lift off, a resist pattern 34 is selectively formed at a region excluding at least the insulating film 7D at the cut face along the line A—A by the i radiation stepper or the like. Further, an upper annular magnetic layer 4U comprising a material the same as that of the bottom annular magnetic layer 4B (for example, NiFe) is formed by utilizing the resist pattern 34 by using, for example, the sputtering apparatus.

Figure 20A:
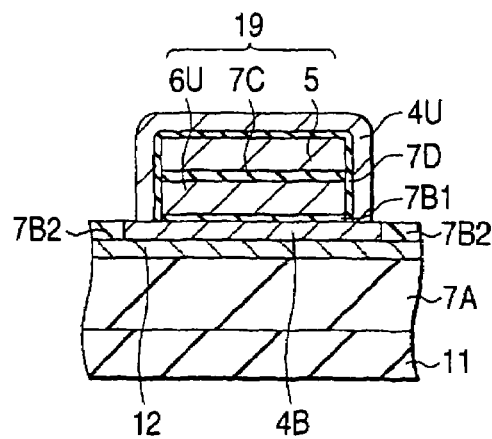
FIGS. 20A and 20B illustrates enlarged sectional views showing a step successive to FIGS. 19A and 19B.
Figure 20B:
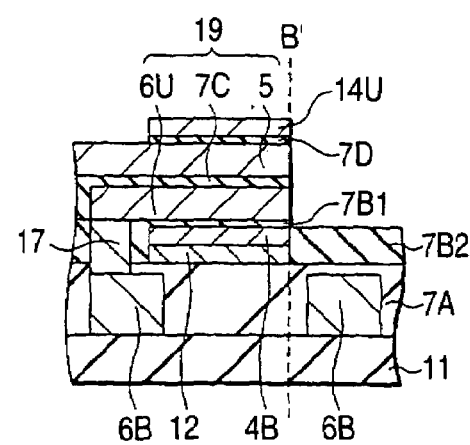

Next, as shown by FIGS. 20A and 20B, by removing the resist pattern 34 by lift off, the upper annular magnetic layer 4U is exposed.

Figure 21A:
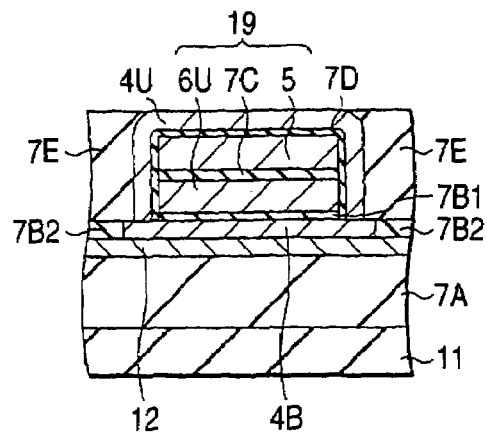
FIGS. 21A and 21B illustrate enlarged sectional views showing a step successive to FIGS. 20A and 20B.
Figure 21B:
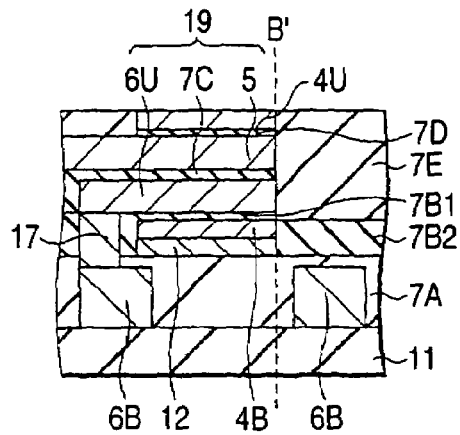

Successively, as shown by FIGS. 21A and 21B after forming an insulating film 7E over the entire face by the CVD apparatus or the like the surface of the insulating film 7E is polished by the CMP apparatus or the like to flatten, the upper face of the upper annular magnetic layer 4U is exposed and the upper annular magnetic layer 4U is machined to a predetermined thickness.

Figure 22A:
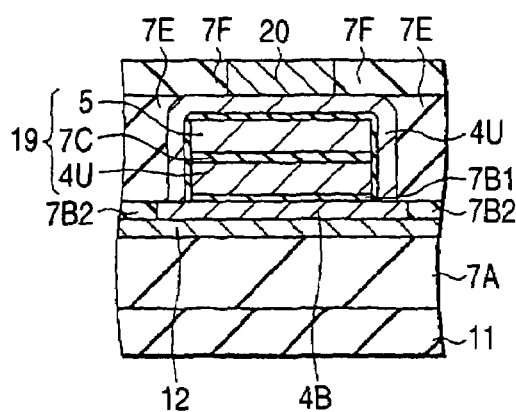
FIGS. 22A and 22B illustrate enlarged sectional views showing a step successive to FIGS. 21A and 21B.
Figure 22B:
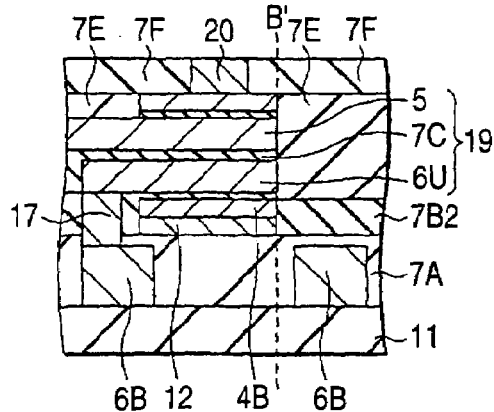

Further, as shown by FIGS. 22A and 22B, the TMR element 20 is formed above the upper annular magnetic layer 4U. Specifically, first, a resist pattern is selectively formed to cover a region other than a region of forming the TMR element 20 by the i radiation step or the like. Next, an aluminum (Al) layer is formed over the entire face. The tunnel barrier layer 3 is provided by subjecting the aluminum layer to an oxidation treatment. Successively, formation of the TMR element 20 is finished by forming the first magnetic layer 2 comprising, for example, a CoFe layer, forming a protective layer or the like and removing the resist pattern 35. Further, in FIGS. 22A and 22B, illustration of respective layers constituting the TMR element 20 is omitted for simplification.

After forming the TMR element 20, an insulating film 7F is formed over the entire face by the CVD apparatus and thereafter the surface of the insulating film 7F is polished by the CMP apparatus to flatten and to expose the uppermost face of the TMR element 20.

Figure 23A:
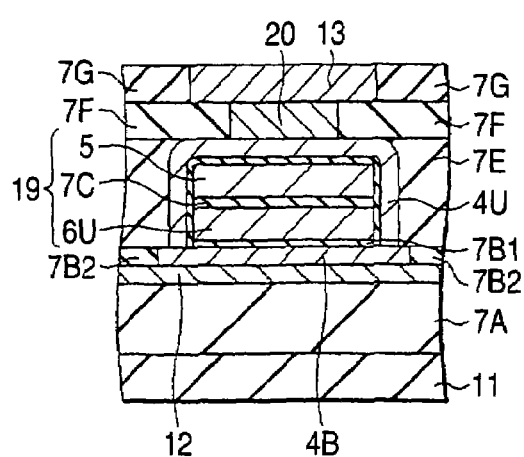
FIGS. 23A and 23B illustrate enlarged sectional views showing a step successive to FIGS. 22A and 22B.
Figure 23A:
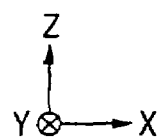
Figure 23B:
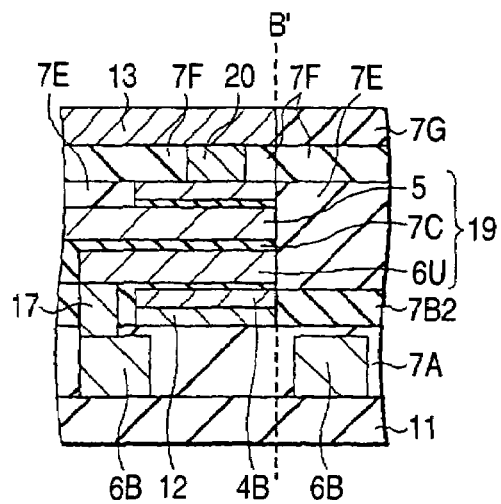
Figure 23B:
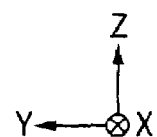

Finally, as shown by FIGS. 23A and 23B, the read bit line 13 is formed. Specifically, a multilayer film 13A is formed by laminating layers of titanium (Ti), titanium nitride (TiN) and aluminum (Al) in this order by using a magnetron sputtering apparatus. Next, a resist pattern (not illustrated) having a predetermined shape is formed and the multilayer film 13A at an unprotected portion is removed by carrying out, for example, RIE by constituting the mask by the resist pattern. Thereby, the read bit line 13 having a predetermined shape is formed.

Thereafter, the write word line drawout electrodes 41 are formed at respective two terminals of the write word line 6, the write bit line drawout electrodes 42 are formed at respective two terminals of the write bit line 5, read word line drawout electrodes 43 are formed at respective two terminals of the read word line 12 and read bit line drawout electrodes 44 are formed at respective two terminals of the read bit line 13.

As described above, formation of the memory cell group 54 including the memory cells 1 is tentatively finished.

Thereafter, further, by being processed by a step of forming a protective layer of $SiO_2$, $Al_2O_3$ or the like and a step of exposing the respective drawout electrodes 41 through 44 by polishing the protective film by the sputtering apparatus, CVD apparatus or the like, fabrication of the magnetic memory device is finished.

As described above, according to the embodiment, the TMR element 20 includes the annular magnetic layer 4 formed in the annular shape, constituted to be penetrated by the write bit line 5 and the write word line 6 and functioning as the magnetosensitive layer and the laminated body constituted such that current is made to flow in the direction orthogonal to the laminated layer face and therefore, the closed magnetic path can be formed by making current flow to both of the write bit line 5 and the write word line 6, inversion of magnetization at the annular magnetic layer (magnetosensitive layer) 4 of TMR element 20 can further efficiently be carried out and magnetic influence is reduced to effect on a memory cell contiguous to the memory cell 1 constituting the object of writing.

Further, according to the embodiment, the write bit line 5 and the write word line 6 form the parallel portion 10 at a region penetrating the annular magnetic layer 4 and therefore, the synthesized magnetic field generated at the annular magnetic layer (magnetosensitive layer) 4 by making current flow to the write bit line 5 and the write word line 4 can be made to be larger than that in the case of intersecting the write lines with each other and inversion of magnetization at the annular magnetic layer (magnetosensitive layer) 4 can further efficiently be carried out. As a result, write current necessary for inversion of magnetization can further be reduced.

In addition thereto, according to the embodiment, the laminated layer structure 19 is formed self-adjustingly by constituting the mask by the write bit line 5 and therefore, highly accurate machining can be carried out, the step of forming the resist pattern and the step of removing the resist pattern and the like can be omitted and the fabricating steps can be simplified as a whole.

[Second Embodiment]

Next, an explanation will be given of a magnetic memory device according to a second embodiment of the invention in reference to FIGS. 24A through 24C.

Figure 24A:
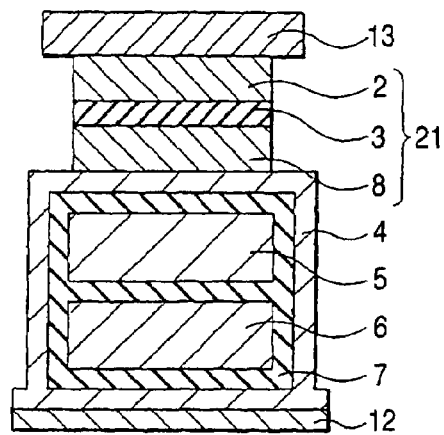
FIGS. 24A to 24C illustrate sectional views showing a constitution of an essential portion in a magnetic memory device according to a second embodiment of the invention.

FIG. 24A shows a sectional constitution of the memory cell 1 in a magnetic memory device according to the embodiment in correspondence with FIG. 7A. In FIG. 24A, portions substantially the same as constituent elements shown in FIG. 7A are attached with the same notations.

Further, in the following explanation, with regard to a constitution of the magnetic memory device according to the embodiment and a method of fabricating the same, an explanation will mainly be given of points different from those of the first embodiment and other explanation will pertinently be omitted.

According to the magnetic memory device of the first embodiment, a portion of the annular magnetic layer 4 in the TMR element 20 is constituted to serve also as the magnetosensitive layer. In contrast thereto, according to the magnetic memory device of the embodiment, as shown by FIG. 24, a second magnetic layer 8 functioning as a magnetosensitive layer is provided separately from the annular magnetic layer 4 and a TMR element 21 in which the second magnetic layer 8 and the annular magnetic layer 4 are brought into a magnetic exchange coupling is provided.

The second magnetic layer 8 is provided between the tunnel barrier layer 3 and the annular magnetic layer 4 and a magnetizing direction thereof is changed by an external magnetic field. The second magnetic layer 8 comprises, for example, a single substance of cobalt (Co), a cobalt iron alloy (CoFe), a cobalt platinum alloy (CoPt) or a nickel Iron cobalt alloy (NiFeCo).

The magnetizing direction of the second magnetic layer 8 can further be stabilized by being provided separately from the annular magnetic layer 4. In this case, the coercive force of the annular magnetic layer 4 can be made smaller than that in the case in which the second magnetic layer 8 is not provided and the annular magnetic layer 4 functions also as the magnetosensitive layer, for example, the coercive force of the annular magnetic layer 4 can be made to be less than $(50/4\pi) \times 10^3$ A/m.

Successively, an explanation will be given of writing operation in the magnetic memory device according to the embodiment in reference to FIGS. 24B and 24C. FIGS. 24B and 24C show a section at the A—A cut line of the memory cell 1 shown in FIG. 4, showing a relationship between the current direction and the magnetizing direction.

Figure 24B:
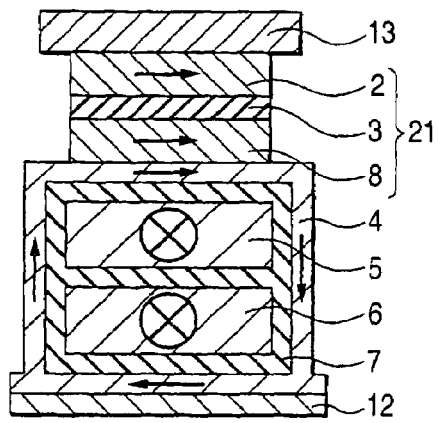
Figure 24C:
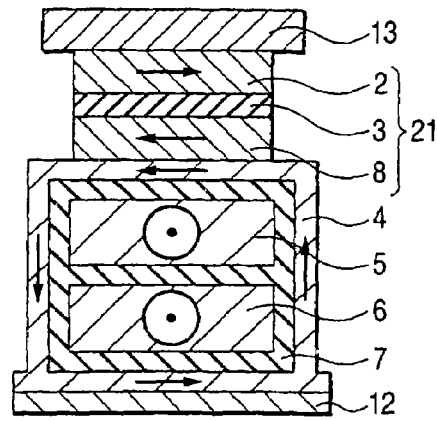
Figure 24C:
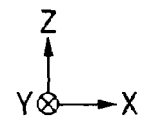

FIGS. 24B and 24C show a case in which write current is made to flow to the write bit line 5 and the write word line 6 in parallel with each other passing the memory cell 1 in directions the same as each other. FIG. 24B shows a case in which write current is made to flow in the direction orthogonal to the paper face from this side to the depth side (to Y direction) and a circulating current magnetic field is generated in the clockwise direction at inside of the annular magnetic layer 4. In this case, a magnetizing direction of the second magnetic layer 8 becomes a direction along the magnetizing direction of the annular magnetic layer 4, that is, X direction. Meanwhile, FIG. 24C shows a case in which write current is made to flow in the direction orthogonal to the paper face from the depth side to this side (to −Y direction) and a circulating current magnetic field is generated in the counterclockwise direction at inside of the annular magnetic layer 4. Also in this case, the magnetizing direction of the second magnetic layer 8 becomes a direction along the magnetizing direction of the annular magnetic layer 4 and becomes −X direction. According to the embodiment, the external magnetic field at the second magnetic layer 8 indicates a magnetic field generated by write current flowing in the write bit line 5 and the write word line 6, or a circulating current magnetic field generated at the annular magnetic layer 4. When current is made to flow in the write bit line 5 and the write word line 6 in the same direction, the magnetizing direction of the second magnetic layer 8 is inverted to record 0 or 1. For example, when the state of FIG. 24B is set to 0, the state of FIG. 24C is identified as 1. Here, the magnetizing direction of the second magnetic layer 8 is not inverted and data is not rewritten when write current is made to flow in directions opposed to each other, or when write current is made to flow only at either one thereof.

In fabricating the magnetic memory device according to the embodiment, after forming the upper annular magnetic layer 4U by a procedure explained in the first embodiment, the TMR element 21 is formed above the upper annular magnetic layer 4U by the following way. Specifically, first, a resist pattern is selectively formed to cover a region other than a region of forming the TMR element 21 by the i radiation stepper or the like. Next, the second magnetic layer 8 comprising, for example, a cobalt iron alloy (CoFe) and an aluminum (Al) layer are formed in this order over the entire face by the sputtering apparatus or the like. Next, the tunnel barrier layer 3 is provided by subjecting the aluminum layer to an oxidation treatment by oxygen plasma or the like. Further, after successively forming the second magnetic layer 2 comprising, for example, a CoFe layer and a protective layer comprising tantalum (Ta) or the like by the sputtering apparatus or the like, the resist pattern 35 is removed. Thereby, formation of the TMR element 21 having the first magnetic layer 2 and the tunnel barrier layer 3 and the second magnetic layer 8 is finished. Thereafter, fabrication of the magnetic memory device is finished after having been processed by predetermined steps similar to those of the first embodiment.

As described above, according to the magnetic memory device of the embodiment, in addition to the constitution according to the first embodiment, the second magnetic layer 8 is provided between the tunnel barrier layer 3 and the annular magnetic layer 4. Therefore, the annular magnetic layer 4 and the second magnetic layer 8 can form an exchange coupling. Therefore, further stabilized writing can be carried out by further excellently aligning the magnetizing direction of the second magnetic layer 8 as the magnetosensitive layer. Further, the coercive force of the annular magnetic layer 4 can further be reduced and therefore, the heat generation can be reduced by reducing the current value in writing operation and function as the magnetic memory device can sufficiently be achieved.

[Third Embodiment]

Next, an explanation will be given of a magnetic memory device according to a third embodiment of the invention.

Figure 25A:
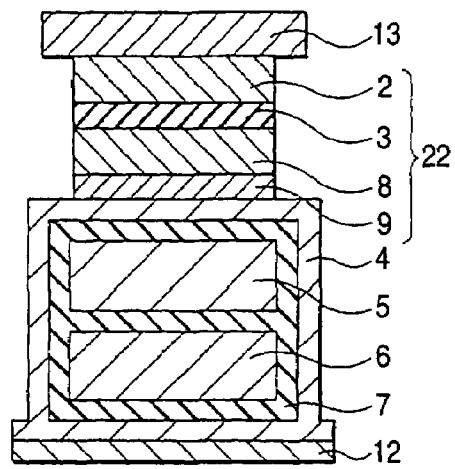
FIGS. 25A to 25C illustrate sectional views showing a constitution of an essential portion in a magnetic memory device according to a third embodiment of the invention.

FIG. 25A shows a sectional constitution of a memory cell in a magnetic memory device according to the embodiment in correspondence with FIG. 7A and FIG. 24A. In FIG. 25A, portions substantially the same as constituent elements shown in FIG. 7A and FIG. 24A are attached with the same notations.

Further, in the following explanation, with regard to a constitution of the magnetic memory device and a method of fabricating the magnetic memory device according to the embodiment, an explanation will mainly be given of points different from those of the first and the second embodiments and other explanation will pertinently be omitted.

The magnetic memory device according to the first embodiment is constituted such that a portion of the annular magnetic layer 4 of the TMR element 20 is constituted to serve also as the magnetosensitive layer. According to the magnetic memory device of the second embodiment, further, as shown by FIG. 24, the second magnetic layer 8 functioning as the magnetosensitive layer is provided separately from the annular magnetic layer 4 and the TMR element 21 in which the second magnetic layer 8 and the annular magnetic layer 4 are brought into the magnetic exchange coupling.

In contrast thereto, according to the magnetic memory device of the embodiment, as shown by FIG. 25A, a nonmagnetic conductive layer 9 for bringing the second magnetic layer 8 and the annular magnetic layer 4 into an antiferromagnetic coupling is provided between the second magnetic layer 8 and the annular magnetic layer. The nonmagnetic conductive layer functions to bring the annular magnetic layer 4 and the second magnetic layer 8 into the antiferromagnetic coupling and is constituted by, for example, ruthenium (RU), copper (Cu) or the like.

According to the magnetic memory device of the embodiment, by bringing the annular magnetic layer 4 and the second magnetic layer 8 into the antiferromagnetic coupling, even when the coercive force of the annular magnetic layer 4 is less than $(50/4\pi) \times 10^3$ A/m, no problem is posed, and the annular magnetic layer 4 can be constituted by, for example, iron (Fe), NiFe, CoFe, NiFeCo, cobalt (Co) or the like.

The second magnetic layer 8 becomes a portion of holding record and is stabilized by an anisotropic magnetic field by the antiferromagnetic coupling. It is preferable that the coercive force of the second magnetic layer 8 falls in a range equal to or smaller than $(100/4\pi) \times 10^3$ A/m and is constituted to be smaller than the coercive force of the first magnetic layer 2.

Figure 25B:
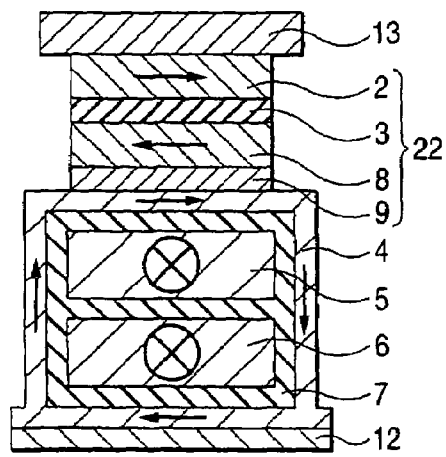
Figure 25C:
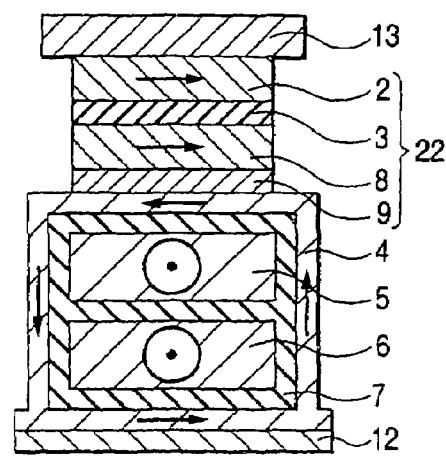
Figure 25C:
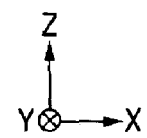

Successively, an explanation will be given of writing operation of the magnetic memory device according to the embodiment in reference to FIGS. 25B and 25C. FIGS. 25B and 25C shows a section at the A—A cut line of the memory cell 1 shown in FIG. 4, showing a relationship between the current direction and the magnetizing direction.

FIGS. 25B and 25C show a case in which write current in directions the same as each other flow to the write bit line 5 and the write word line 6 in parallel with each other passing the memory cell 1. FIG. 25B shows a case in which write current is made to flow in the direction orthogonal to the paper face from this side to the left side (to Y direction) and a circulating current magnetic field is generated in the clockwise direction at inside of the annular magnetic layer 4. In this case, the magnetizing direction in the second magnetic layer 8 becomes a direction opposed to the magnetizing direction of the annular magnetic layer 4, that is, −X direction. On the other hand, FIG. 25C shows a case in which write current is made to flow in the direction orthogonal to the paper face from the depth side to this side (to −Y direction) and a circulating current magnetic field is generated in the counterclockwise direction at inside of the annular magnetic layer 4. Also in this case, the magnetizing direction of the second magnetic layer 8 becomes a direction opposed to the magnetizing direction of the annular magnetic layer 4 and becomes X direction. According to the embodiment, the external magnetic field for the second magnetic layer 8 indicates a magnetic field generated by write current flowing to the write bit line 5 and the write word line 6, or a circulating current magnetic field generated at the annular magnetic layer 4. When current flows to the write bit line 5 and the write word line 6 in this way in the same direction, the magnetizing direction of the second magnetic layer 8 is inverted to record 0 or 1. For example, when the state of FIG. 25B is set to 0, the state of FIG. 25C is identified as 1. Here, the magnetizing direction of the second magnetic layer 8 is not inverted and data is not rewritten when write current is made to flow in directions opposed to each other, or when the write current is made to flow only to either one thereof.

In fabricating the magnetic memory device according to the embodiment, after forming the annular magnetic layer 4U by the procedure explained in the first embodiment, a TMR element 22 having the nonmagnetic conductive layer 9 is formed on the upper annular magnetic layer 4U by the following way. Specifically, first, a resist pattern is selectively formed to cover a region other than a region of forming the TMR element 22 by the i radiation stepper or the like. Next, the nonmagnetic conductive layer 9, the second magnetic layer 8 comprising a cobalt iron alloy (CoFe) and an aluminum (Al) layer are formed in this order over the entire face by, for example, the sputtering apparatus. Successively, by subjecting the aluminum layer to the oxidation treatment by oxygen plasma or the like, the tunnel barrier layer 3 is provided. Further, the first magnetic layer 2 comprising, for example, a CoFe layer and a protective film comprising tantalum (Ta) or the like are formed in this order by the sputtering apparatus or the like and thereafter, the resist pattern 35 is removed. Thereby, formation of the TMR element 22 having the first magnetic layer 2, the tunnel barrier layer 3, the second magnetic layer 8 and the nonmagnetic conductive layer 9 is finished. Thereafter, fabrication of the magnetic memory device is finished after having been processed by predetermined steps similar to those of the first embodiment.

In this way, according to the magnetic memory device of the embodiment, in addition of the constitution of the second embodiment, the nonmagnetic conductive layer 9 is further provided between the annular magnetic layer 4 and the second magnetic layer 8. Thereby, the strong antiferromagnetic coupling can be formed between the annular magnetic layer 4 and the second magnetic layer 8 and therefore, the magnetizing direction of the second magnetic layer 8 as the free layer is further stabilized without being disturbed by an unnecessary magnetic field of an external disturbance magnetic field or the like. In addition thereto, the coercive force of the annular magnetic layer 4 can further be reduced by the above-described constitution. Therefore, the heat generation amount can be reduced by reducing the current value in writing operation, further, a metal element or the like can be shielded from diffusing to move to the second magnetic layer 8 by the nonmagnetic conductive layer 9 and therefore, thermal stability is promoted. As a result, further stabilized writing can be carried out.

MODIFIED EXAMPLES

Next, an explanation will be given of modified examples, according to the embodiment in reference to FIG. 26 as follows.

First Modified Example

The TMR element 22 according to the embodiment is constituted by a structure referred to as the coercive force difference type having the first magnetic layer 2 having the coercive force larger than that of the second magnetic layer 8. In contrast thereto, a TMR element 22B shown in FIG. 26A shows a structure referred to as the exchange bias type for fixing the magnetizing direction of the first magnetic layer 2 by the exchange coupling.

Specifically, the TMR element 22B includes a nonmagnetic conductive layer 9, the second magnetic layer 8, the tunnel barrier layer 3, the first magnetic layer 2 and a third magnetic layer 15 in this order from the side of the annular magnetic layer 4. The third magnetic layer 15 is provided with antiferromagnetism, functions to fix the magnetizing direction of the first magnetizing layer 2 by exchange interactive operation with the first magnetic layer 2, and constituted by an antiferromagnetic material of, for example, a platinum manganese alloy (PtMn), iridium manganese alloy (IrMn), iron manganese (FeMn), nickel manganese (NiMn) or ruthenium manganese (RuMn) or the like.

Figure 26A:
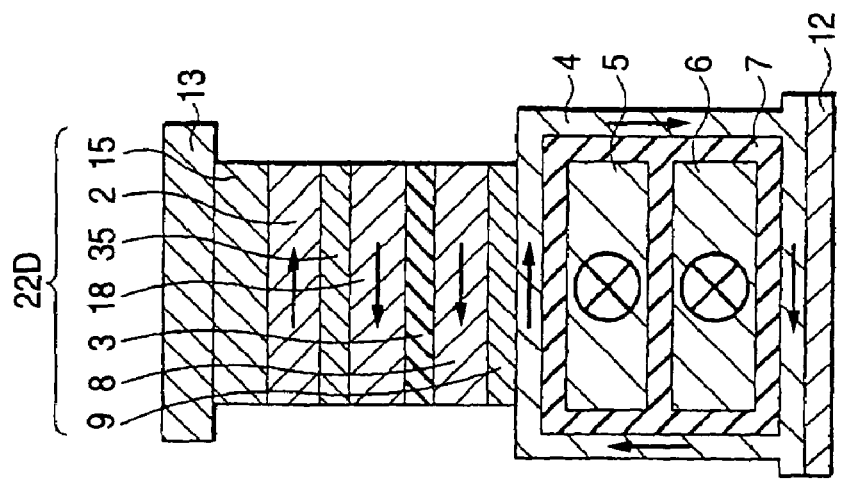
FIGS. 26A to 26C illustrate sectional views showing constitutions of essential portions of a first through a third modified example of the magnetic memory device shown in FIG. 25.

In the case of the TMR element 22B having the structure of the exchange bias type shown in FIG. 26(A), the magnetizing direction of the first magnetizing layer 2 can stably be fixed by the third magnetic layer 15 and therefore, the coercive force of the first magnetic layer 2 may be less than $(50/4\pi) \times 10^3$ A/m.

Second Modified Example

Figure 26B:
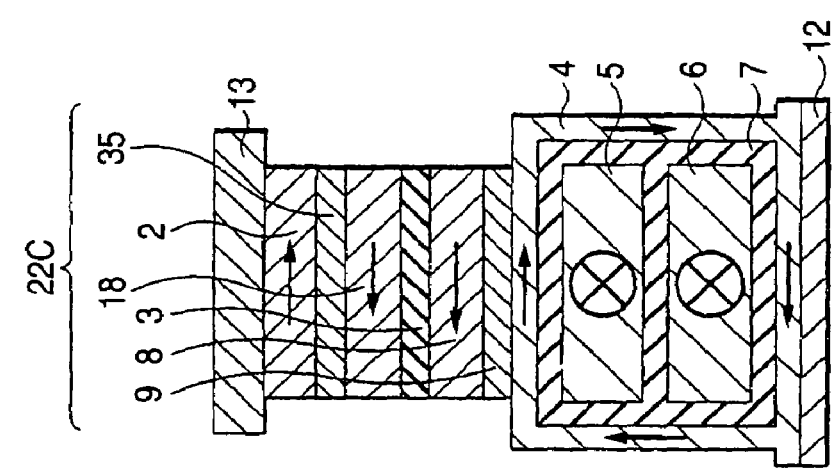

FIG. 26B shows a constitution of a TMR element 22C in which a nonmagnetic conductive layer 35 and a fourth magnetic layer 18 are provided between the first magnetic layer 2 and the tunnel barrier layer 3 in the constitution of the TMR element 22 according to the embodiment.

Specifically, the TMR element 22C includes the nonmagnetic conductive layer 9, the second magnetic layer 8, the tunnel barrier layer 3, the fourth magnetic layer 18, the nonmagnetic conductive layer 35 and the first magnetic layer 2 in this order from the side of the annular magnetic layer 4. The fourth magnetic layer 18 forms an antiferromagnetic coupling with the first magnetic layer 2 via the nonmagnetic conductive layer 35 and the magnetizing directions of the first magnetic layer 2 and the fourth magnetic layer 18 are in parallel and opposite direction with each other. The fourth magnetic layer 18 is constituted by, for example, iron (Fe), NiFe, CoFe, NiFeCo or cobalt (Co) or the like.

According to the modified example, by the above-described constitution, a closed magnetic path is formed by a magnetostatic field at the first magnetic layer 2 and the fourth magnetic layer 18 and therefore, the modified example is difficult to be effected with influence by an external magnetic field to stabilize and detouring of a magnetic field to the second magnetic layer 8 can be restrained. Therefore, the write current magnetic field can be reduced when the magnetizing direction of the second magnetic layer 8 as the free layer is inverted.

Third Modified Example

Figure 26C:
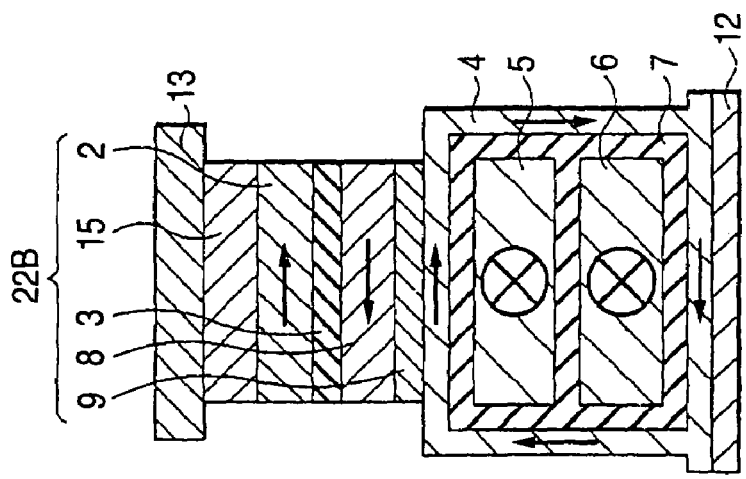

FIG. 26C shows a TMR element 22D which is a modified example in which in addition to the constitution of the TMR element 22C of the second modified example, a third magnetic layer 15 is further provided. Specifically, the TMR element 22D includes the nonmagnetic conductive layer 9, the second magnetic layer 8, the tunnel barrier layer 3, the fourth magnetic layer 18, the nonmagnetic conductive layer 35, the first magnetic layer 2 and the third magnetic layer 15 in this order from the side of the annular magnetic layer 4.

In the case of the TMR element 22D, the magnetizing direction of the first magnetic layer 2 can stably be fixed by the third magnetic layer 15 and therefore, the coercive force of the first magnetic layer 2 can be made to be less than $(50/4\pi) \times 10^3$ A/m.

EXAMPLE

Further, an explanation will be given of a specific example of the embodiment.

According to the example, a magnetic memory device is formed by the following way based on the above-described fabricating method. Details thereof will be explained in reference to FIG. 8 through FIG. 23.

First, as shown by FIG. 8, the board 11 comprising silicon (Si) is prepared, a layer of titanium (Ti) having a thickness of 10 nm, a layer of titanium nitride (TiN) having a thickness of 10 nm and a layer of aluminum (Al) having a thickness of 500 nm are laminated in this order on the board 11 by using the magnetron sputtering apparatus to form the multiplayer film 16B. Next, after coating a predetermined resist over the entire face, the resist pattern 31 having a predetermined shape is formed by using the i radiation reduction stepper. The reactive ion etching (RIE) is selectively carried out by constituting the mask by the resist pattern 31 and using boron trichloride ($BCl_3$) gas as the reactive gas. Thereby, as shown by FIG. 9, the lower write word line 6B having a predetermined shape is formed. In this case, the lower write word line 6B is formed such that a width thereof along X direction becomes 700 nm.

Next, as shown by FIG. 10, the insulating film 7A comprising silicon oxide ($SiO_2$) is formed to cover the total by the CVD (Chemical Vapor Deposition) apparatus by using TEOS (tetraethylorthosilicate; $Si(OC_2H_5)_4$). Thereafter, the surface of the insulating film 7A is flattened by the CMP (chemical Mechanical Polishing) apparatus. At this occasion, the insulating film 7A is formed such that the thickness of the insulating film 7A formed on the lower write word line 6B becomes 500 nm.

Thereafter, as shown by FIG. 11, the read word line 12 and the bottom annular magnetic layer 4B are selectively formed in this order at a region on the flattened insulating film 7A in correspondence with at least a portion of the parallel portion 10 of the write bit line 5 and the write word line 6. Specifically, first, a film of titanium (Ti) having the thickness of 10 nm, a film of TiN having the thickness of 10 nm and a film of aluminum (Al) having the thickness of 500 nm are formed in this order on the insulating film 7A by the magnetron sputtering apparatus to form a multilayer film (not illustrated) for constituting the read word line 12 later. Thereafter, a resist is coated to cover the total and a resist pattern (not illustrated) is formed to cover the total by using the i radiation stepper. The read work line 12 is formed by patterning the multilayer film by carrying out the RIE treatment by using $BCl_3$ as the reactive gas by utilizing the resist pattern. Next, a resist pattern (not illustrated) is formed by using the i radiation stepper to dip in the plating tank of $FeSO_4$ and $NiSO_4$ and conduct electricity to thereby form a plated film (not illustrated) comprising the nickel iron alloy (atomic ratio; Ni:Fe=80*20). Thereafter, the bottom annular magnetic layer 4B is formed by patterning the plated film. A size of the read word line 12 and the bottom annular magnetic layer 4B formed by patterning is set to 1100 nm (X direction)×350 nm (Y direction).

After patterning to form the read word line 12 and the bottom annular magnetic layer 4B, as shown by FIGS. 12A and 12B, the insulating film 7B is formed over the entire face by the CVD apparatus by suing TEOS and the surface of the insulating film 7B is flattened by the CMP apparatus. At this occasion, the thickness of the insulating film 7B on the bottom annular magnetic layer. 4B is set to 150 nm. Further, the via hole 7H for connecting the upper write word line 6U and the lower word line 6B is formed (refer to FIG. 12B). In this case, a resist is coated on the insulating film 7B, a resist pattern is formed by the i radiation stepper and thereafter, the via hole 7H is formed by RIE using $C_4F_8$ as the reactive gas.

Successively, the interlayer connecting layer 17 is formed as shown by FIG. 13B by embedding aluminum (Al) into the via hole 7H by using the LTS (Long Throw Sputtering) apparatus. Thereafter, the metal multilayer film 16U comprising a layer of titanium (Ti) having the thickness of 10 nm, a layer of titanium nitride (TiN) having the thickness of 10 nm and a layer of aluminum (Al) having the thickness of 500 nm is formed over the entire face similarly by using the LTS apparatus as shown by FIGS. 13A and 13B.

After forming a resist pattern (not illustrated) over the entire face on the metal multilayer film 16U by the i radiation stepper, the metal multilayer film 16U is patterned by carrying out the RIE treatment using $BCl_3$ gas as the reactive gas by utilizing the resist pattern as the mask. Thereby, as shown by FIGS. 14A and 14B, the upper write word line 6U is formed. The width of the upper write word line 6U along X direction is set to 700 nm.

Figure 16A:
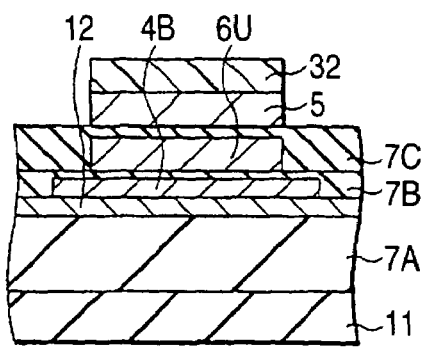
FIGS. 16A and 16B illustrate enlarged sectional views showing a step successive to FIGS. 15A and 15B.
Figure 16B:
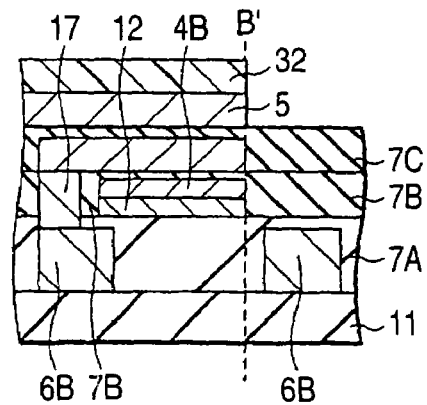

After forming the upper write word line 6U, as shown by FIGS. 15A and 15B, the insulating film 7C is formed over the entire face by the CVD apparatus by using TEOS and the surface of the insulating film 7C is flattened by the CMP apparatus. A film of titanium (Ti) having the thickness of 10 nm, a film of TiN having the thickness of 10 nm and a film of aluminum (Al) having the thickness of 500 nm are formed on the flattened insulating film 7C by using the magnetron sputtering apparatus to thereby form the multilayer film 5A for constituting the write bit line 5 later. Further, after coating a resist on the multilayer film 5A, as shown by FIGS. 16A and 16B, the resist pattern 32 is selectively formed by the i radiation stepper.

The multilayer film 5A is patterned by carrying out the RIE treatment using $BCl_3$ gas as a reactive gas by utilizing the resist pattern 32 as the mask. Thereby, the write bit line 5 having the thickness along X direction of 700 nm is formed.

Next, as shown by FIGS. 17A and 17B, the laminated layer structure 19 is self-adjustingly formed by constituting the mask by the write bit line 5. Specifically, the laminated layer structure 19 is formed by removing the total of the insulating film 7C at a region which is not protected by the write bit line 5 and portions of the insulating film 7B and the upper write word line 6U in the thickness direction by RIE using $C_4F_8$ as the reactive gas and ion milling.

After forming the laminated layer structure 19 at the parallel portion 10 of the write bit line 5 and the write word line 6, as shown by FIGS. 18A and 18B, the insulating film 7D comprising $SiO_2$ is formed to cover the side face and the upper face of the laminated layer structure 19. Specifically, after forming the resist pattern 33 selectively at a region excluding at least the laminated layer structure 19 in the cut face along line A—A, the insulating film 7D is formed over the entire face by the CVD apparatus or the like by using TEOS.

Next, by forming the upper annular magnetic layer 4U to cover selectively the side face and the upper face of the insulating film 7D and to connect to the bottom annular magnetic layer 4B, formation of the annular magnetic layer 4 comprising the bottom annular magnetic layer 4B and the upper annular magnetic layer 4U is finished. The annular magnetic layer 4 is formed to surround a portion of the parallel portion 10 of the write bit line 5 and the write word line 6 over a length of 350 nm along Y direction.

Specifically, as shown by FIGS. 19A and 19B, after removing the resist pattern 33 by lift off, the resist pattern 34 is selectively formed at the region excluding at least the insulating film 7D in the cut face along line A—A by the i radiation stepper or the like. Further, the upper annular magnetic layer 4U comprising a material the same as a material (NiFe) of the bottom annular magnetic layer 4B is formed by utilizing the resist pattern 34 by using the sputtering apparatus.

Next, as shown by FIGS. 20A and 20B, by removing the resist pattern 34 by lift off, the upper annular magnetic layer 4U is exposed.

Successively, as shown by FIGS. 21A and 21B after forming the insulating film 7E over the entire face by the CVD apparatus by using TEOS, the surface of the insulating film 7E is polished by the CMP apparatus to flatten and the upper face of the upper annular magnetic layer 4U is exposed. Further, polishing is carried out until the thickness of the upper annular magnetic layer 4U becomes 50 nm.

Here, as shown by FIGS. 22A and 22B, the TMR element 20 is formed on the upper annular magnetic layer 4U. Specifically, first, a resist pattern (not illustrated) is selectively formed to cover a region other than the region of forming the TMR element 20 by the i radiation stepper or the like. Next, the nonmagnetic conductive layer 9 comprising ruthenium (Ru) having the thickness of 0.7 nm, the second magnetic layer 8 comprising a cobalt iron alloy (CoFe) having the thickness of 5 nm and the aluminum (Al) layer having the thickness of 1 nm are formed in this order over the entire face by a high vacuum direct current sputtering apparatus. The tunnel barrier layer 3 is provided by subjecting the aluminum layer to the oxidation treatment by oxidation plasma under pressure of 13.33 Pa. Further, after forming the first magnetic layer 2 comprising CoFe having the thickness of 5 nm, the third magnetic layer 15 comprising IrMn having the thickness of 50 nm and a protective film (not illustrated) comprising tantalum (Ta) having the thickness of 5 nm, formation of the TMR element 22B of FIG. 26A is finished by removing the resist pattern.

After forming the TMR element 22B, the insulating film 7F is formed over the entire face by the CVD apparatus by using TEOS, the surface of the insulating film 7F is polished to flatten by the CMP apparatus and the uppermost face of the TMR element 22B is exposed.

Finally, as shown by FIGS. 23A and 23B, the read bit line 13 is formed. Specifically, a layer of titanium (Ti) having the thickness of 10 nm, a layer of titanium nitride (TiN) having the thickness of 10 nm and a layer of aluminum (Al) having the thickness of 500 nm are laminated in this order by using the magnetron sputtering apparatus to thereby form the multilayer film 13A. Next, the multilayer film 13A at the unprotected portion is removed by carrying out RIE by constituting the mask by the resist pattern. Thereby, the read bit line 13 having the predetermined shape is formed.

Thereafter, after forming a resist pattern by using the i radiation stepper, an aluminum layer is formed to constitute a thickness of 45 μm by the magnetron sputtering apparatus.

Thereby, the write word line drawout electrodes 41 are formed at respective two terminals of the write word line 6, the write bit line drawout electrodes 42 are formed at respective two terminals of the write bit line 5, the read word line drawout electrodes 43 are formed at respective two terminals of the read word line 12 and the read bit line drawout electrodes 44 are formed at respective two terminals of the read bit line 13. Successively, after forming aluminum oxide ($Al_2O_3$) as a protective film to cover the total by using the magnetron sputtering apparatus, the respective drawout electrodes 41 through 44 are exposed by polishing. Formation of the magnetic memory device aligned with 4 elements in the vertical direction and 4 elements in the horizontal direction in the matrix shape is finished after having been processed by predetermined steps (refer to FIG. 4).

Figure 27:
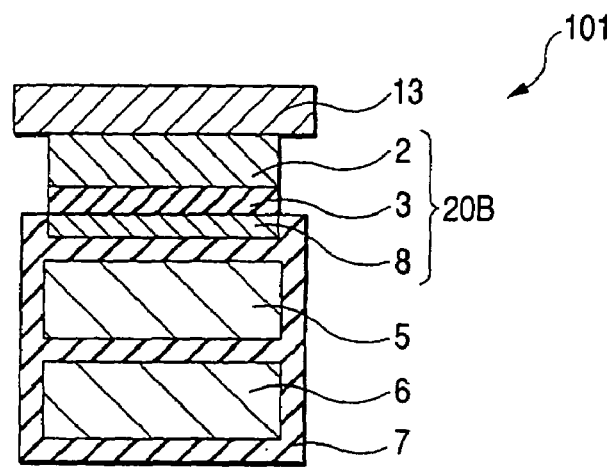
FIG. 27 is a sectional view for explaining a constitution of an essential portion of a magnetic memory device as a first comparative example in the magnetic memory device shown in FIG. 1.
Figure 28:
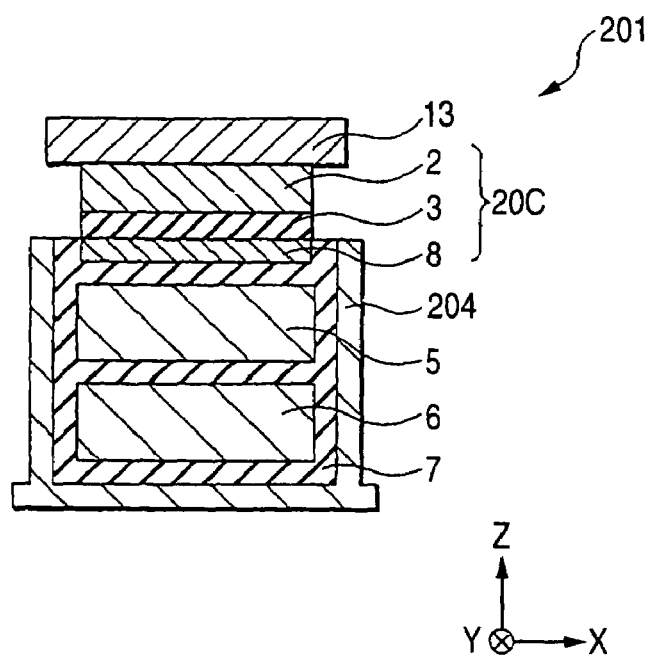
FIG. 28 is a sectional view for explaining a constitution of an essential portion of a magnetic memory device as a second comparative example in the magnetic memory device shown in FIG. 1.

With respect to the magnetic memory device fabricated by the above-described way, MR ratio, tunnel resistance Rt, switching current and contiguous cell inverting current have been measured. A result thereof is shown in Table 1 as an example. Here, in order to make a comparison of numerical values, similar measurement is carried out also with respect to magnetic memory devices each having a memory cell of a structure which is not provided with a continuous annular magnetic layer shown in FIGS. 27 and 28 and therefore, a result of the measurement is added to Table 1 as Comparative Examples 1 and 2. Further, an applied magnetic field in measurement is set to $(500/4\pi)\times10^3$ A/m. Although a memory cell 101 as Comparative Example 1 shown in FIG. 27 is provided with the write bit line 105 and the write word line 106 embedded in the insulating film 7 and extended in parallel with each other and the TMR element 20B provided at a vicinity thereof, the memory cell 101 is not provided with a annular magnetic layer surrounding the write bit line 105 and the write word line 106 at all. A memory cell 201 as Comparative Example 2 shown in FIG. 28 on one side is constituted by surrounding a large portion of a surrounding of the write bit line 5 and the write word line 6 embedded in the insulating film 7 and extended in parallel with each other by the annular magnetic layer 204 a section of which constitutes a "channel"-like shape and the second magnetic layer 8 of the TMR element 20C. However, the annular magnetic layer 204 in the "channel"-like shape is not provided with a portion which is brought into contact with the second magnetic layer 8.

TABLE 1

| | MR ratio % | tunnel resistance $\Omega \cdot (\mu m)^2$ | switching current mA | contiguous cell inverting current mA |
|---|---|---|---|---|
| Example | 40 | 970 | 1.7 | 20.0 or more |
| Comparative Example 1 | 40 | 950 | 6.8 | 12.0 |
| Comparative Example 2 | 40 | 975 | 2.75 | 20.0 or more |

As shown in Table 1, although a considerable difference is not observed between the example and the comparative examples 1 and 2 with respect to the MR ratio and the tunnel resistance Rt, a clear significant difference can be confirmed therebetween with respect to the switching current and the contiguous cell inverting current.

The switching current is a necessary minimum current value for inverting a magnetizing direction of a memory cell constituting object of writing. With respect to the switching current, the embodiment shows a small value of substantially a quarter of that of comparative example 1. The small value shows that writing operation can be carried out even by small current since magnetization of the magnetosensitive layer can efficiently be inverted.

The contiguous cell inverting current inverting current indicates a current value by which a magnetizing direction of a memory cell which is not to be written inherently is inverted by current supplied to the memory cell contiguous to a memory cell constituting an object of writing. As shown by Table 1, according to the embodiment, it is known that even when write current which is larger than that of the prior art is applied, the magnetizing direction at the contiguous memory cell is not inverted. This shows that a closed magnetic path is formed and a magnetic field effecting adverse influence on the contiguous memory cell can be restrained from being generated.

As has been explained above, according to the embodiment, the TMR element 22B includes the annular magnetic layer 4 formed in the annular shape, constituted to be penetrated by the write bit line 5 and the write word line 6 and functioning as the magnetosensitive layer and the laminated body constituted such that current flows in the direction orthogonal to the laminated layer face and therefore, the closed magnet path can be formed by making current flow to both of the write bit line 5 and the write word line 6, magnetization of the annular magnetic layer 4 of the TMR element 22B can further efficiently be inverted and magnetic influence on a memory cell contiguous to a memory cell constituting an object of writing can be reduced.

Figure 29A:
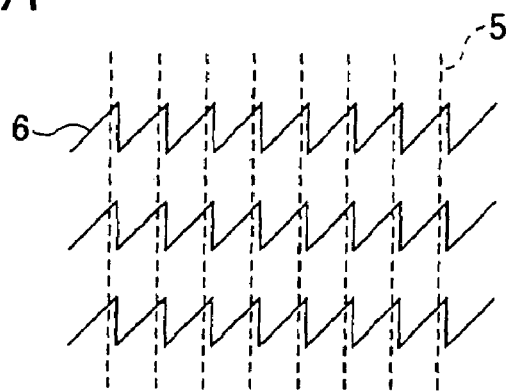
FIGS. 29A to 29C illustrate plane views showing modified examples in a constitution of a write line of the magnetic memory device shown in FIG. 1.
Figure 29B:
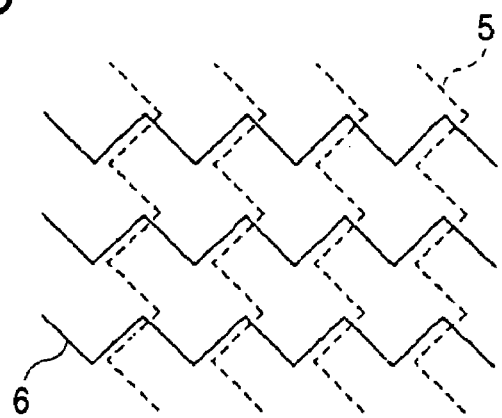
Figure 29C:
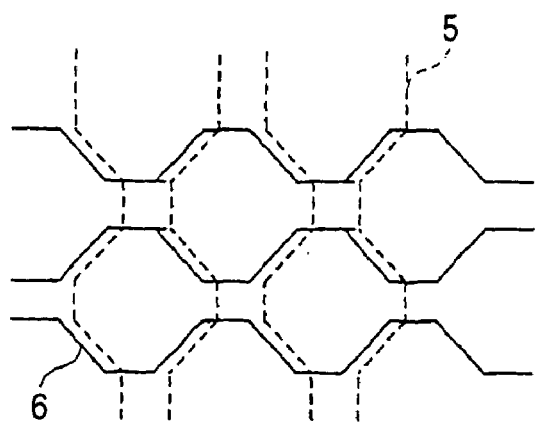
Figure 30:
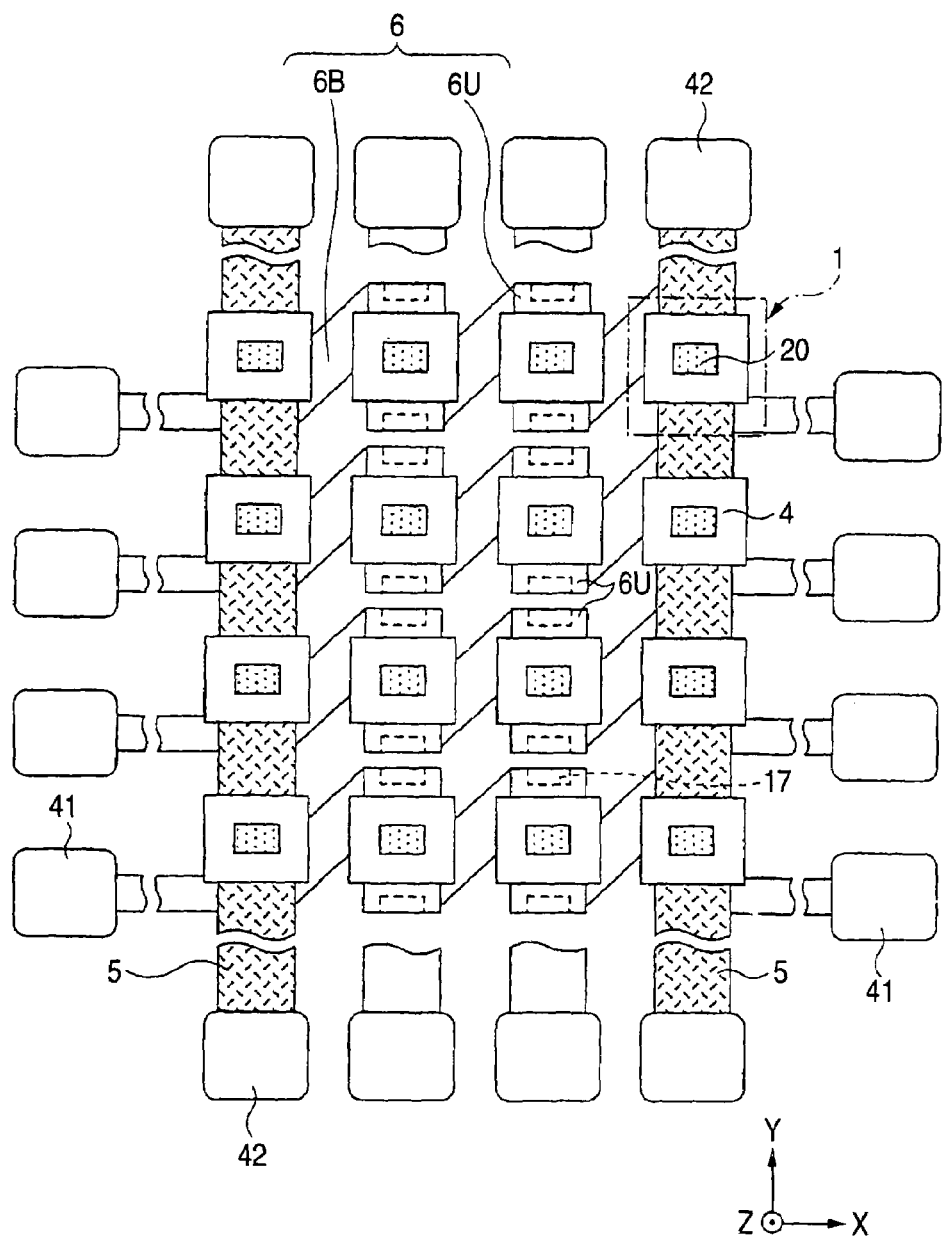
FIG. 30 is a partial plane view showing a constitution of an essential portion of the modified example shown in FIG. 29.

Although an explanation has been given of the invention by showing several embodiments and modified examples, the invention is not limited to the embodiments and the modified examples but can variously be modified. For example, although according to the embodiment, the write word line 6 is bent to extend in the shape of the rectangular wave, as shown by FIG. 29A, the write word line 6 may be bent to constitute a shape of a sawtooth (shape of triangular wave). In that case, the memory cells 1 are arranged as shown by FIG. 30. Further, although according to the embodiment, only the write word line 6 is bent and portions of the write word line 6 are connected to each other via the interlayer connecting layer 17 embedded in the via hole 7H, only the write bit line 5 may be bent, or both of the write word line 6 and the write bit line 5 may be bent as shown by FIGS. 29B and 29C. In FIG. 29B, the write bit line 5 having a pattern of being bent in an "angle"-like shape and extended in one direction as a whole and the write word line 6 having a pattern of similarly bent in an "angle"-like shape and extended in one direction different from that of the write bit line 5 as a whole are constituted to intersect with each other such that portions of the "angle"-like shapes are in parallel with each other. FIG. 29C shows a pattern in which the write bit lines 5 contiguous to each other are extended in a constant direction as a whole while changing an interval therebetween within a predetermined range, the write word lines 6 contiguous to each other are extended in a constant direction different from that of the write bit line 5 as a whole while changing an interval therebetween within a predetermined range and portions of the write bit line 5 and the write word line 6 are in parallel with each other. That is, the lines are constituted such that while maintaining shapes symmetrical with each other relative to a lower layer straight line along an advancing direction, the lines are extended to repeat approaching portions and separating portions alternately. Here, the approaching portion and the separating portion constitute a portion of a contour of a trapezoidal shape.

Further, the write bit line 5 may constitute a loop shape in which both ends thereof are connected to the current drive circuit 56C. Similarly, the write word line 6 may constitute a loop shape in which both ends thereof are connected to the current drive circuit 58C.

Figure 31:
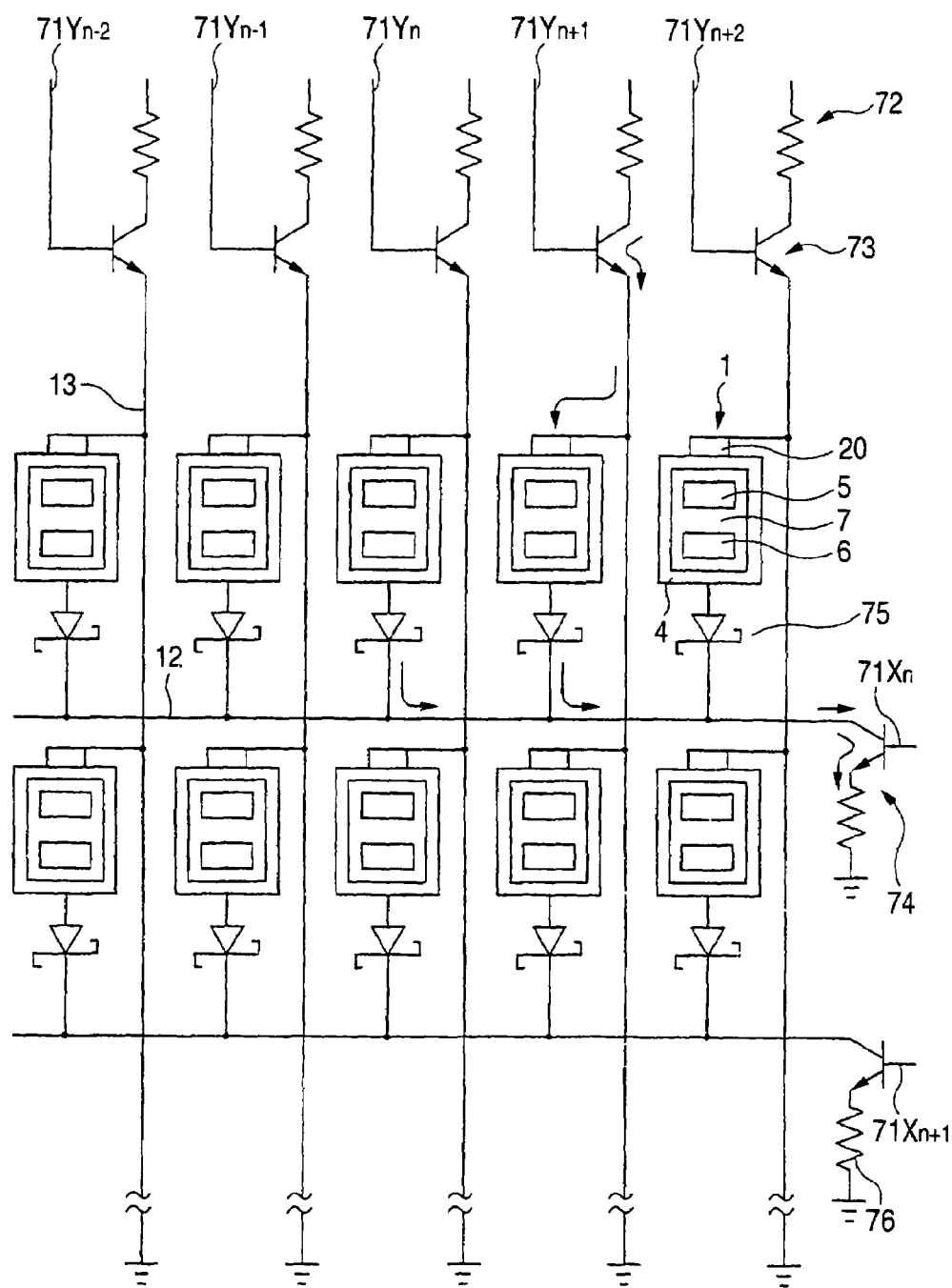
FIG. 31 is a plane view showing a modified example in a circuit constitution of the magnetic memory device shown in FIG. 1.
Figure 32:
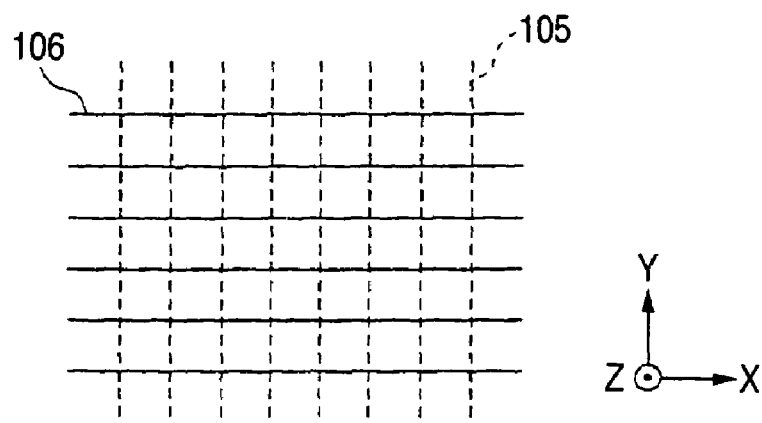
FIG. 32 is a plane view for explaining a constitution of a magnetic memory device according to a prior art.
Figure 33:
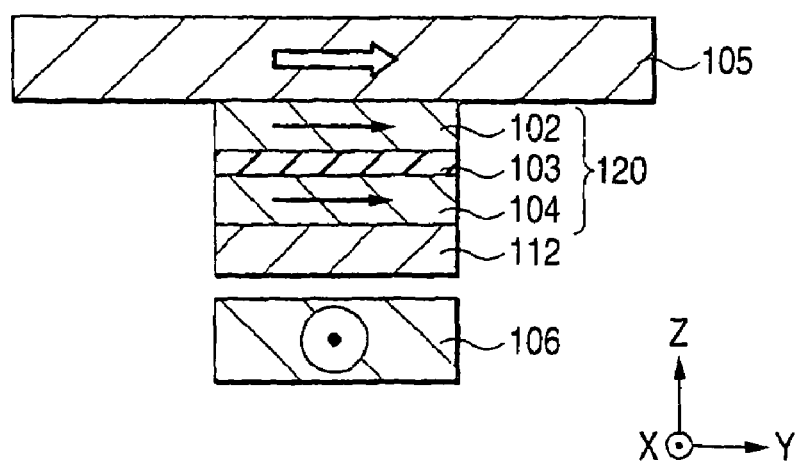
FIG. 33 is a sectional view for explaining a constitution of an essential portion of the magnetic memory device according to the prior art.

Further, as shown by FIG. 31, by arranging a rectifying element 75 between each of the memory cells 1 and the word decode line 71X, further stabilized flow of current can be ensured.

Further, although according to the embodiment, an explanation has been given of a case in which the write bit line 5 and the write word line 6 respectively constitute the parallel portion 10, the embodiment is not limited thereto but the write bit line 5 and the write word line 6 may not in parallel with each other. However, when the annular magnetic layer 4 is formed to surround the parallel portion 10, inversion of magnetization of the magnetosensitive layer can efficiently be carried out which is further preferable.

As explained above, the magnetoresistive effect element according to the invention comprises a laminated body including a magnetosensitive layer a magnetizing direction of which is changed by an external magnetic field and constituted such that a current is made to flow in a direction orthogonal to a laminated layer face thereof, and a annular magnetic layer arranged at a side of one face of the laminated body to constitute an axial direction by a direction along the laminated layer face and constituted to be penetrated by a plurality of lead wires, and therefore, a closed magnetic path can be formed by making current flow to a plurality of lead wires and inversion of magnetization in the magnetosensitive layer can further efficiently be carried out.

The magnetic memory device according to the invention comprises a plurality of first write lines, a plurality of second write lines extended to respectively intersect with the plurality of first write lines, and a plurality of magnetoresistive effect elements each having a laminated body including a magnetosensitive layer a magnetizing direction of which is changed by an external magnetic field and constituted such that a current flows in a direction orthogonal to a laminated layer face thereof, wherein the magnetoresistive effect element includes a annular magnetic layer arranged to a side of one face of the laminated body such that an axial direction thereof is constituted by a direction along the laminated layer face and constituted to be penetrated by the first write line and the second write line and therefore, a closed magnetic path can be formed by making current flow to both of the first write line and the second write line, inversion of magnetization in the annular magnetic layer can further efficiently be carried out and magnetic effect can be reduced to effect on a memory cell contiguous to a memory cell constituting an object of writing.

Particularly, according to the magnetoresistive effect element or the magnetic memory device, the plurality of write lines are constituted to extend in parallel with each other at a region of penetrating the annular magnetic layer and therefore, a synthesized magnetic field generated at the magnetosensitive layer by making current flow to the plurality of lead wires can be made to be larger than that in the case of intersecting the lead wires with each other and inversion of magnetization in the annular magnetic layer can further efficiently be carried out. As a result, write current necessary for inversion of magnetization can further be reduced. Further, the magnetizing direction of a plurality of magnetic domains in the magnetosensitive layer can further excellently be aligned and therefore, higher reliability is achieved.

The method of fabricating a magnetic memory device according to the invention includes a step of self-adjustingly forming a laminated layer structure in parallel portions of a first and a second write line extended in parallel with each other by selectively etching to remove the first write line and a second insulating layer interposed by the first and the second write lines by constituting a mask by the second write line and therefore, highly accurate machining can be carried out and fabricating steps can be simplified.

The invention claimed is:

1. A magnetoresistive effect element comprising:
 a laminated body including a magnetosensitive layer a magnetizing direction of which is changed by an external magnetic field and constituted such that a current is made to flow in a direction orthogonal to a laminated layer face thereof;
 an annular magnetic layer arranged at a side of one face of the laminated body to constitute an axial direction by a direction along the laminated layer face; and
 a plurality of lead wires penetrating said annular magnetic layer.

2. The magnetoresistive effect element according to claim 1, wherein the laminated body is electrically connected to the annular magnetic layer.

3. The magnetoresistive effect element according to claim 1, wherein the plurality of lead wires are extended in parallel with each other at a region penetrating the annular magnetic layer.

4. The magnetoresistive effect element according to claim 1, wherein a portion of the annular magnetic layer serves also as the magnetosensitive layer.

5. The magnetoresistive effect element according to claim 1, wherein the magnetosensitive layer is provided separately from the annular magnetic layer and the magnetosensitive layer and the annular magnetic layer are brought into a magnetic exchange coupling.

6. The magnetoresistive effect element according to claim 5, wherein a nonmagnetic conductive layer is provided between the magnetosensitive layer and the annular magnetic layer to bring the magnetosensitive layer and the annular magnetic layer into an antiferromagnetic coupling.

7. The magnetoresistive effect element according to claim 1, wherein the magnetosensitive layer is provided with a coercive force larger than a coercive force of the annular magnetic layer.

8. The magnetoresistive effect element according to claim 1, wherein the laminated body comprising:
 a nonmagnetic layer;
 a first magnetic layer laminated to one side of the nonmagnetic layer and having a fixed magnetizing direction; and
 a second magnetic layer laminated to a side of the nonmagnetic layer opposed to the first magnetic layer and functioning as the magnetosensitive layer;
 wherein information is detected based on a current flowing in the laminated body.

9. The magnetoresistive effect element according to claim 8, wherein the first magnetic layer is provided with a coercive force larger than a coercive force of the second magnetic layer.

10. The magnetoresistive effect element according to claim 8, wherein an antiferromagnetic third magnetic layer which is brought into an exchange coupling with the first magnetic layer is arranged on a side of the first magnetic layer opposed to the nonmagnetic layer.

11. The magnetoresistive effect element according to claim 8, wherein a fourth magnetic layer brought into an exchange coupling with the first magnetic layer is arranged between the first magnetic layer and the nonmagnetic layer.

12. The magnetoresistive effect element according to claim 11, wherein a second nonmagnetic conductive layer for bringing the first magnetic layer and the fourth magnetic layer into an antiferromagentic coupling is arranged between the first magnetic layer and the fourth magnetic layer.

13. The magnetoresistive effect element according to claim 8, wherein the nonmagnetic layer comprises an insulating layer capable of bringing about a tunnel effect.

14. A magnetic memory device comprising:
a plurality of first write lines;
a plurality of second write lines extended to respectively intersect with the plurality of first write lines; and
a plurality of magnetoresistive effect elements each having a laminated body including a magnetosensitive layer a magnetizing direction of which is changed by an external magnetic field and constituted such that a current flows in a direction orthogonal to a laminated layer face thereof, and a annular magnetic layer arranged to a side of one face of the laminated body such that an axial direction thereof is constituted by a direction along the laminated layer face and constituted to be penetrated by the first write line and the second write line.

15. The magnetic memory device according to claim 14, wherein the laminated body is electrically connected to the annular magnetic layer.

16. The magnetic memory device according to claim 14, wherein the first write line and the second write line are extended in parallel with each other at a region penetrating the annular magnetic layer.

17. The magnetic memory device according to claim 14, wherein a portion of the annular magnetic layer serves also as the magnetosensitive layer.

18. The magnetic memory device according to claim 14, wherein the magnetosensitive layer is provided separately from the annular magnetic layer and the magnetosensitive layer and the annular magnetic layer are brought into a magnetic exchange coupling.

19. The magnetic memory device according to claim 18, wherein an interval between the magnetosensitive layer and the annular magnetic layer is arranged with a nonmagnetic conductive layer for bringing the magnetosensitive layer and the annular magnetic layer into an antiferromagnetic coupling.

20. The magnetic memory device according to claim 14, wherein the laminated body comprising:
a nonmagnetic layer;
a first magnetic layer laminated to one side of the nonmagnetic layer and having a fixed magnetizing direction; and
a second magnetic layer laminated to a side of the nonmagnetic layer opposed to the first magnetic layer and functioning as the magnetosensitive layer;
wherein information is detected based on a current flowing in the laminated body.

21. The magnetic memory device according to claim 20, wherein the second magnetic layer is provided with a coercive force larger than a coercive force of the annular magnetic layer.

22. The magnetic memory device according to claim 20, wherein the first magnetic layer is provided with a coercive force larger than a coercive force of the second magnetic layer.

23. The magnetic memory device according to claim 20, wherein an antiferromagnetic third magnetic layer brought into an exchange coupling with the first magnetic layer is arranged on a side of the first magnetic layer opposed to the nonmagnetic layer.

24. The magnetic memory device according to claim 20, wherein a fourth magnetic layer brought into an exchange coupling with the first magnetic layer is arranged between the first magnetic layer and the nonmagnetic layer.

25. The magnetic memory device according to claim 24, wherein a second nonmagnetic conductive layer for bringing the first magnetic layer and the fourth magnetic layer into an antiferromagnetic coupling is arranged between the first magnetic layer and the fourth magnetic layer.

26. The magnetic memory device according to claim 20, wherein the nonmagnetic layer comprises an insulating layer capable of bringing about a tunnel effect.

27. The magnetic memory device according to claim 16, wherein parallel portions of the first and the second write lines extended in parallel with each other are formed by bending at least one of the first and the second write lines.

28. The magnetic memory device according to claim 27, wherein one of the first and the second write lines is extended in a shape of a rectangular wave, other thereof is extended in a linear shape and a rise portion and a fall portion of the shape of the rectangular wave correspond with the parallel portions.

29. The magnetic memory device according to claim 27, wherein the bent first or second write line is constituted to include two layer portions connected with each other via an interlayer connecting layer comprising a conductive material.

30. The magnetic memory device according to claim 14, further comprising:
a plurality of read lines for making a read current flow in a direction orthogonal to the laminated layer face of the laminated body in each of the magnetoresistive effect elements;
wherein information is read based on a current flowing in the laminated body.

31. The magnetoresistive effect element according to claim 1, wherein at an interface of the annular magnetic layer and the laminated body, an area of the annular magnetic layer is larger than that of the laminated body.

* * * * *